(12) United States Patent
Park

(10) Patent No.: US 7,414,279 B2
(45) Date of Patent: Aug. 19, 2008

(54) SEMICONDUCTOR DEVICE WITH IMPROVED OVERLAY MARGIN AND METHOD OF MANUFACTURING THE SAME

(75) Inventor: Joon-Soo Park, Seongnam-si (KR)

(73) Assignee: Samsung Electronics, Co., Ltd., Suwon-ri (KR)

( * ) Notice: Subject to any disclaimer, the term of this patent is extended or adjusted under 35 U.S.C. 154(b) by 194 days.

(21) Appl. No.: 11/049,428

(22) Filed: Feb. 2, 2005

(65) Prior Publication Data

US 2005/0173750 A1 Aug. 11, 2005

(30) Foreign Application Priority Data

Feb. 6, 2004 (KR) .................. 10-2004-0007828

(51) Int. Cl.
*H01L 27/108* (2006.01)
(52) U.S. Cl. ............... 257/296; 257/216; 257/297; 257/328; 257/E21.655; 257/E21.657
(58) Field of Classification Search .......... 257/256, 257/297, 306
See application file for complete search history.

(56) References Cited

U.S. PATENT DOCUMENTS

| | | | |
|---|---|---|---|
| 5,828,094 A * | 10/1998 | Lee | ............ 257/296 |
| 6,541,828 B2 | 4/2003 | Chang | |
| 6,555,866 B1 | 4/2003 | Kuo | |
| 6,593,613 B1 * | 7/2003 | Alsmeier et al. | ............ 257/306 |
| 6,674,120 B2 * | 1/2004 | Fujiwara | ............ 257/324 |

FOREIGN PATENT DOCUMENTS

KR 010056239 7/2001

\* cited by examiner

*Primary Examiner*—Dao H Nguyen
(74) *Attorney, Agent, or Firm*—F. Cahu & Associates, LLC

(57) ABSTRACT

Semiconductor devices with an improved overlay margin and methods of manufacturing the same are provided. In one aspect, a method includes forming a buried bit line in a substrate; forming an isolation layer in the substrate to define an active region, the isolation layer being parallel to the bit line without overlapping the bit line; and forming a gate line including a gate pattern and a conductive line by forming the gate pattern in the active region and forming a conductive line that extends at a right angle to the bit line across the active region and is electrically connected to the gate pattern disposed thereunder. The gate pattern and the conductive line can be integrally formed.

11 Claims, 23 Drawing Sheets

SEMICONDUCTOR DEVICE WITH IMPROVED OVERLAY MARGIN AND METHOD OF MANUFACTURING THE SAME

This application claims the priority to Korean Patent Application No. 2004-07828, filed on Feb. 6, 2004, the disclosure of which is incorporated herein by reference in its entirety.

BACKGROUND OF THE INVENTION

1. Field of the Invention

The present invention relates, generally, to a semiconductor device and a method of manufacturing the same, and more particularly, to a semiconductor device with an improved overlay margin between stacked layers, and methods of manufacturing the same.

2. Description of the Related Art

Conventional manufacturing methods of forming dynamic random access memories (DRAMs) can be categorized as a stack-type method and a trench-type method. In the former method, an active region is formed on a silicon substrate, a gate is formed thereon using polysilicon, and then a bit line contact plug, a bit line, a storage node contact plug, and a storage node (i.e., a lower electrode of a capacitor) are formed. In the latter method, a trench is formed in a silicon substrate, and a storage node is formed therein, thereby forming a capacitor below the substrate.

For example, a conventional stack-type method is used to embody the layout of a DRAM cell region as shown in FIG. 1. FIG. 2 is a cross-sectional view of a DRAM, taken along line II-II' of FIG. 1. Referring to FIGS. 1 and 2, active regions 2 are repeatedly arranged in rows and columns on a substrate 1. Portions of the substrate 1 other than the active regions 2 correspond to an isolation layer 3. Each pair of gates 4 are arranged to intersect one active region 2. A gap between the gates 4 is filled with a first interlayer dielectric (ILD) 5, and cell pads 6a and 6b are disposed on both sides of each gate 4 in a self-aligned contact manner. A second ILD 7 is disposed on the cell pads 6a and 6b and the gates 4, a bit line contact plug 8 is connected to the cell pad 6b adjacent to a drain, and a bit line 9 is disposed on the bit line contact plug 8 perpendicular to a direction in which the gates 4 extend. A storage node contact plug 10 is disposed on the cell pad 6a adjacent to a source, and a storage node 11 is disposed on the storage node contact plug 10.

In the foregoing stack-type method, after the narrow gap between the gates 4 is filled with the ILD 5, the storage node contact plug 10 is formed between the gates 4 and the bit lines 9 that intersect at a right angle to each other. Thus, it is difficult to increase a gap filling margin and overlay margin. Also, as the height of the storage node 11 increases to increase capacitance, the height of the stack structure also increases. Accordingly, after a capacitor forming process is finished, a step difference between a cell region and a core region increases. As a result, photolithography for a subsequent interconnection process becomes very complicated. On the other hand, in the trench-type method, as pattern pitch is reduced, a region where the storage node is formed is continuously scaled down. Thus, a trench should be formed in a silicon substrate to a larger depth, but this is reaching the technical limit.

In addition, in both of the methods, as the integration density of semiconductor devices increases and the pattern pitch decreases, it is very difficult to increase an overlay margin between stacked layers. This is because reducing the pattern pitch is reaching the resolution limit of exposure equipment.

In manufacturing of highly integrated semiconductor devices, the performance of exposure equipment cannot keep up with manufacturing technologies. Since a reduced pattern pitch reaches the resolution limit of exposure equipment, when complicated patterns are formed, yield is reduced due to poor uniformity and pattern fidelity. Therefore, a new method of precisely forming complicated patterns and increasing an overlay margin in spite of device downscaling is required.

SUMMARY OF THE INVENTION

In general, exemplary embodiments of the present invention include semiconductor devices which improve an overlay margin between stacked layers.

Exemplary embodiments of the present invention also include methods of manufacturing a semiconductor device that precisely form complicated patterns in spite of device downscaling and increase an overlay margin.

According to an exemplary embodiment of the present invention, a semiconductor device comprises a bit line buried in a substrate; an isolation layer, which is disposed in the substrate parallel to the bit line without overlapping the bit line and defines an active region; and a gate line, which includes a gate pattern disposed in the active region and a conductive line that extends at a right angle to the bit line across the active region and is electrically connected to the gate pattern.

According to another exemplary embodiment of the present invention, a method of manufacturing a semiconductor device comprises forming a buried bit line in a substrate; forming an isolation layer in the substrate to define an active region, the isolation layer being parallel to the bit line without overlapping the bit line; and forming a gate line including a gate pattern and a conductive line by forming the gate pattern in the active region and forming the conductive line that extends at a right angle to the bit line across the active region and is electrically connected to the gate pattern disposed thereunder.

According to yet another exemplary embodiment of the present invention, a method of manufacturing a semiconductor device comprises forming a plurality of bit lines, which are buried in a substrate and parallel to each other; forming an isolation layer in the substrate to define a plurality of active regions, the isolation layer being parallel to the bit lines without overlapping the bit lines; forming gate lines, each of which includes a gate pattern and a conductive line, by forming a pair of gate patterns buried in each of the active regions and forming the conductive lines that extend across the active regions at a right angle to the bit lines and are electrically connected to the gate patterns; forming an interlayer dielectric on the gate lines and forming bit line contact plugs in the interlayer dielectric to connect the active regions disposed between the gate lines to the bit lines; and forming storage nodes connected to the remaining active regions via the interlayer dielectric.

These and other exemplary embodiments, features, aspects, and advantages of the present invention will be described and become more apparent from the following detailed description of the exemplary embodiments when read in conjunction with accompanying drawings.

DETAILED DESCRIPTION OF EXEMPLARY EMBODIMENTS

Figure 1:
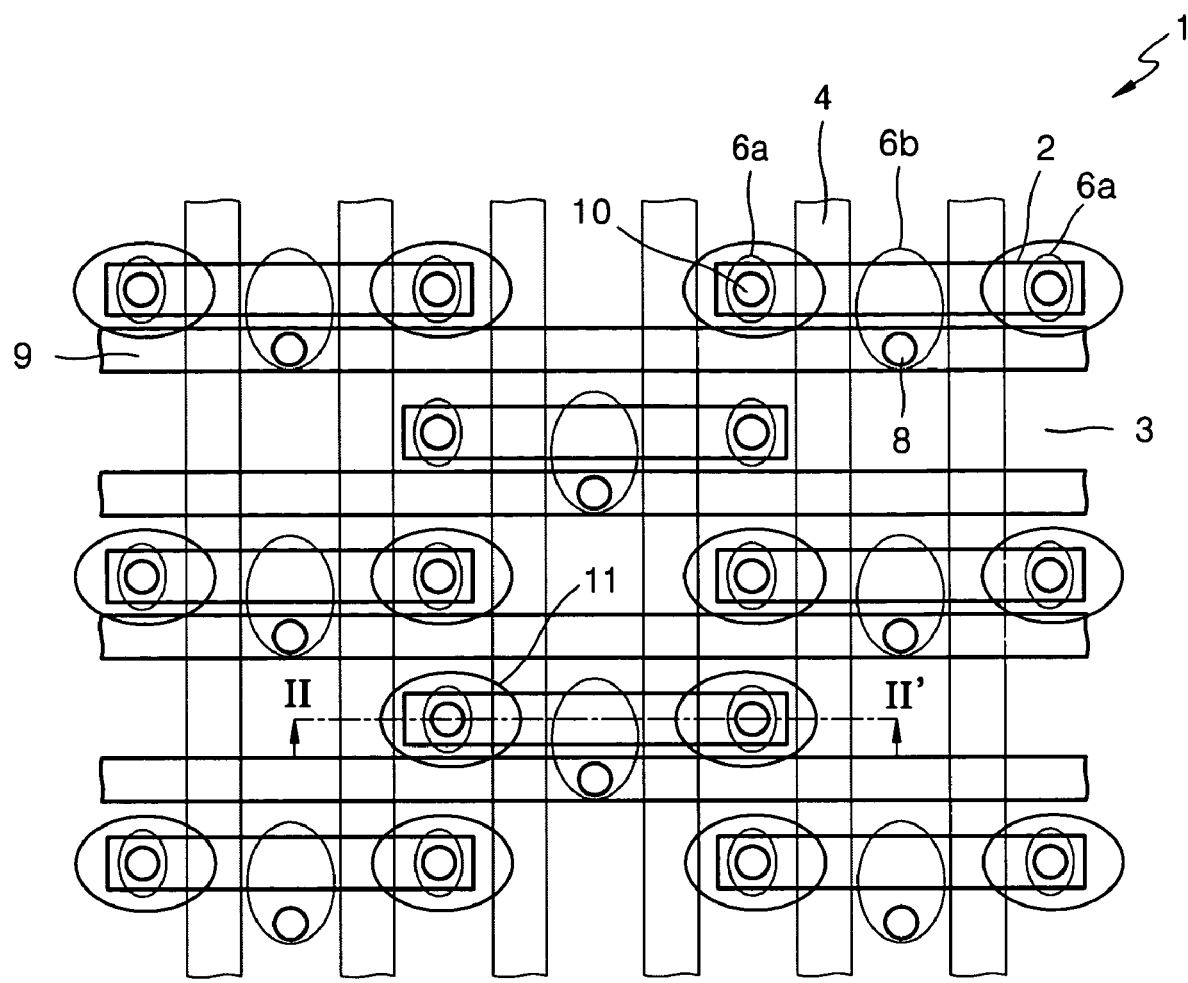
FIG. 1 is a layout of a conventional DRAM cell region.

The present invention will now be described more fully with reference to the accompanying drawings, in which exemplary embodiments of the invention are shown. This invention may, however, be embodied in different forms and should not be construed as being limited to the exemplary embodiments set forth herein. Rather, these exemplary embodiments are provided so that this disclosure will be thorough and complete, and will fully convey the scope of the invention to those skilled in the art. To facilitate understanding, identical reference numerals have been used, where possible, to designate identical elements that are common to the figures.

Semiconductor devices according to the exemplary embodiments of the present invention are physically and electrically improved by changing an integrated stack structure of a cell region of a DRAM, in which pattern pitch is small and patterns are complicated. That is, bit lines and gate patterns are formed in a substrate, and gate lines are formed thereon by forming a simple structure connected to the gate patterns.

Specifically, in a semiconductor device according an exemplary embodiment of the present invention, bit line cell patterns are formed in a substrate in the shape of lines and spaces, active regions are separately formed by simple patterns, such as contacts, and gate patterns are formed in the active regions. Thus, only a simple interconnection line is disposed on the substrate to be connected to the gate patterns of the active regions. As a result, no bit lines are disposed over the gate lines in a cell region, and bit line contact plugs for connecting the active regions to the bit lines are formed to be lower than the gate lines. This allows a decrease in the height of a stack structure for a capacitor, an increase in an overlay margin, and a decrease in contact resistance. Also, patterns of a cell region, which have the smallest pitch and are the most complicated in DRAMs, can have simple shapes of line and space patterns and contact patterns. Thus, small pitch devices can be manufactured, while overcoming the resolution limit of exposure equipment. Further, as patterns in active regions, which have a small pitch and are complicated, can be formed as contact patterns, the process margin during photolithographic patterning can be increased by applying an optimized illumination system to a core region.

Hereinafter, a method of manufacturing a semiconductor device according to an exemplary embodiment will be described in detail.

FIGS. 3 through 24 are each a plan view or cross-sectional view illustrating a method of manufacturing a semiconductor device according to an exemplary embodiment of the present invention.

Figure 3:
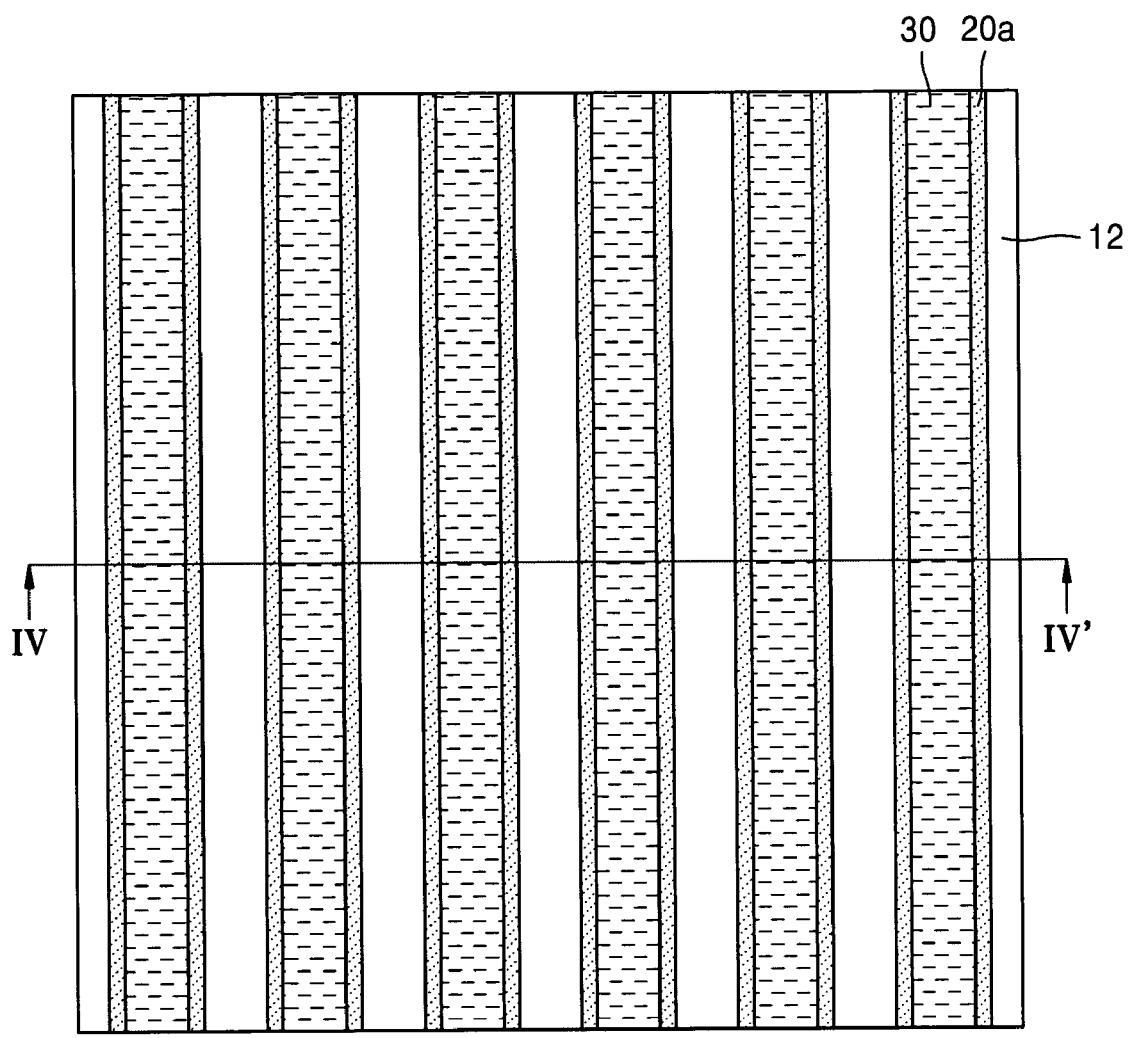
FIGS. 3 through 24 are each a plan view or cross-sectional view illustrating a method of manufacturing a semiconductor device according to an exemplary embodiment of the present invention.

FIG. 3 is a plan view of a plurality of bit lines, which are buried in a substrate 12 parallel to each other. Reference numeral 20a denotes a liner insulating pattern interposed between the bit lines and the substrate 12, and reference numeral 30 denotes a bit line capping layer that covers a bit line. The liner insulating pattern 20a can be omitted.

Figure 4:
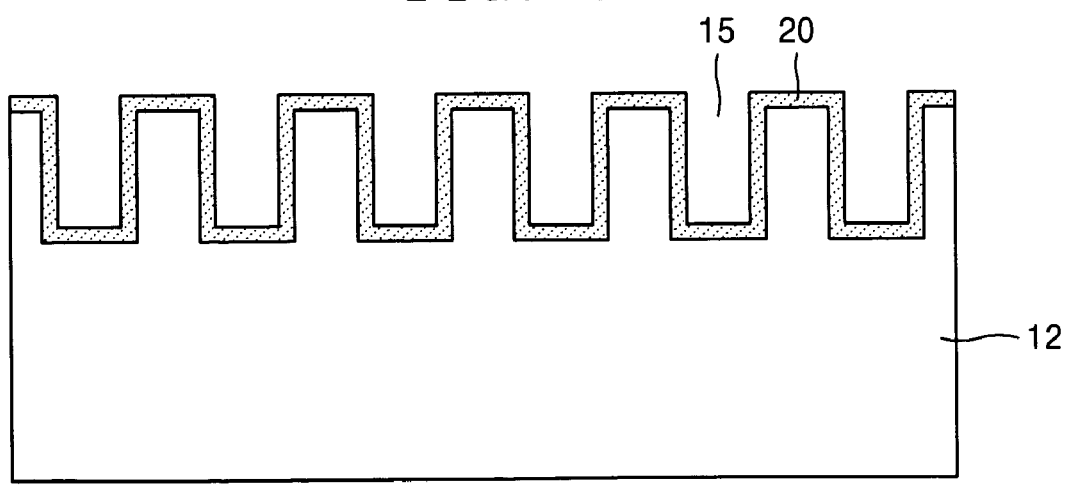
Figure 5:
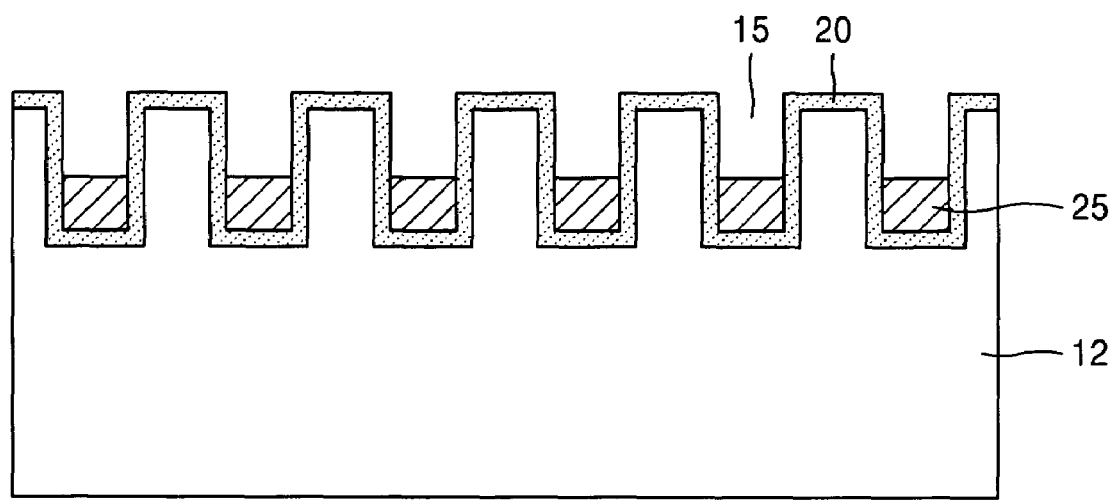
Figure 6:
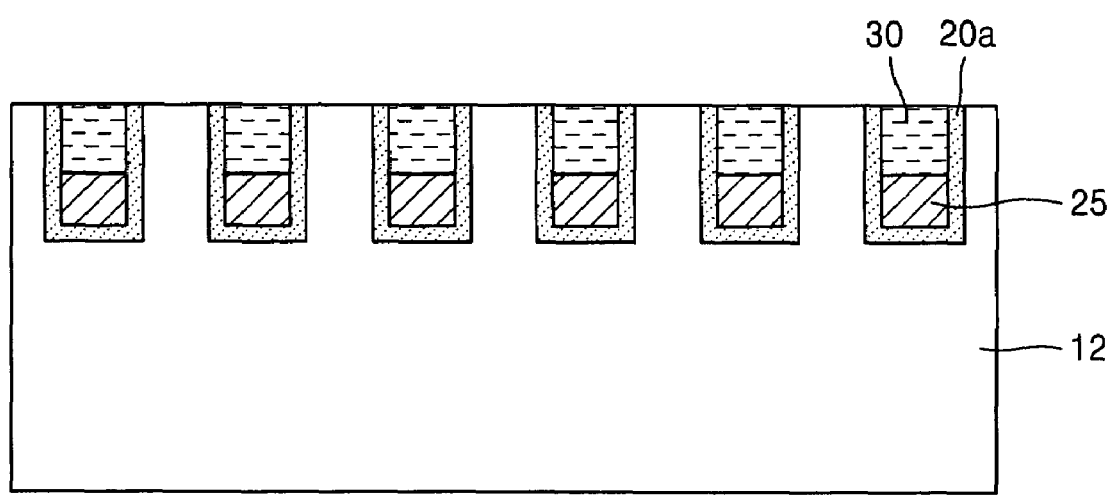

FIGS. 4 through 6 are cross-sectional views taken along line IV-IV' of FIG. 3 for illustrating a process of forming the buried bit lines shown in FIG. 3. The process forms buried bit lines of a cell region in a substrate.

Referring to FIG. 4, a trench 15 is formed in a line shape to bury a bit line in the substrate 12. The trench 15 can be formed by a photolithography process using a line-and-space-type photoresist pattern. If the line-and-space-type photoresist pattern is formed using an illumination system that is optimized to embody a predetermined pattern pitch, controlling of a critical dimension (CD) is easy and pattern fidelity is improved.

Next, a thin liner insulating layer 20 is formed on the inner walls of the trench 15 to electrically isolate the bit line. The liner insulating layer 20 can be formed by depositing an insulating material, such as silicon oxide or silicon nitride, or by thermally oxidizing the substrate 12.

Referring to FIG. 5, a bit line 25 is formed in the trench 15. To form the bit line 25, a conductive layer for a bit line is formed on the substrate 12 so as to fill the trench 15. The conductive layer for forming the bit line 25 can be formed of various conductive materials, for example, doped polysilicon, a metal such as tungsten, and a metal silicide such as tungsten silicide. Then, the conductive layer for the bit line is etched back and recessed into the trench 15. Thus, the bit line 25 is formed in the trench 15 as a line and space type.

As shown in FIG. 6, an insulating layer for a bit line capping layer is deposited on the bit line 25 and planarized using etchback or chemical mechanical polishing (CMP), thereby forming a bit line capping layer 30. Here, the insulating layer for the bit line capping layer 30 can be formed of the same material as the liner insulating layer 20, such as silicon oxide or silicon nitride, or a different material from the liner insulating layer 20.

The bit line capping layer 30 can be formed using various methods. For example, a portion of the liner insulating layer 20, which is formed over the substrate 12, is removed so that a surface of the bit line capping layer 30 is substantially co-planner with a surface of the substrate 12 exposed between the bit line capping layers 30. As a result, a liner insulating pattern 20a is buried in the substrate 12. Alternatively, the insulating layer for the bit line capping layer 30 is deposited and then planarized to a predetermined thickness. Preferably, the predetermined thickness of the insulating layer is thick enough to slightly cover a surface of the substrate 12. Then, a subsequent active region forming process is performed. The active region forming process includes forming a contact pattern, performing dry etching, and depositing an insulating layer. All of the layers remaining on the substrate 12 are then removed so as to expose the surface of the substrate 12. In the present exemplary embodiment, according to the former method, the bit line capping layer 30 is formed, and the liner insulating patterns 20a are buried into the substrate 12.

In the bit line forming process, a process of forming the liner insulating layer 20 and the liner insulating pattern 20a can be omitted. The depth of the bit line 25 can be controlled by adjusting the depth of the trench 15 shown in FIG. 4. However, the process as described with reference to FIG. 5 can further comprise filling a portion of the trench 15 with an insulating material before the conductive layer for the bit line is deposited, to control a bottom position of the bit line 25.

Figure 7:
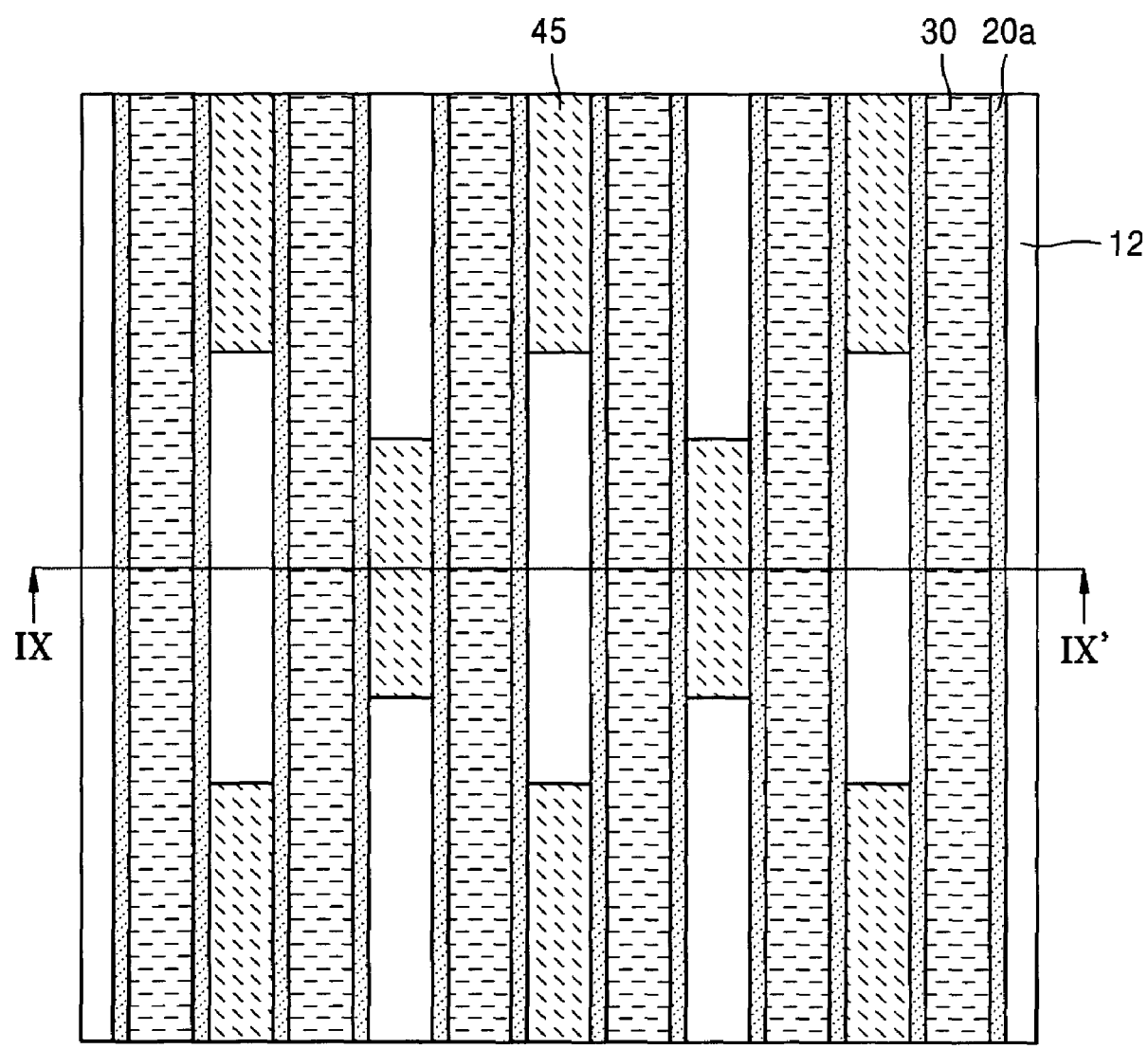
Figure 8:
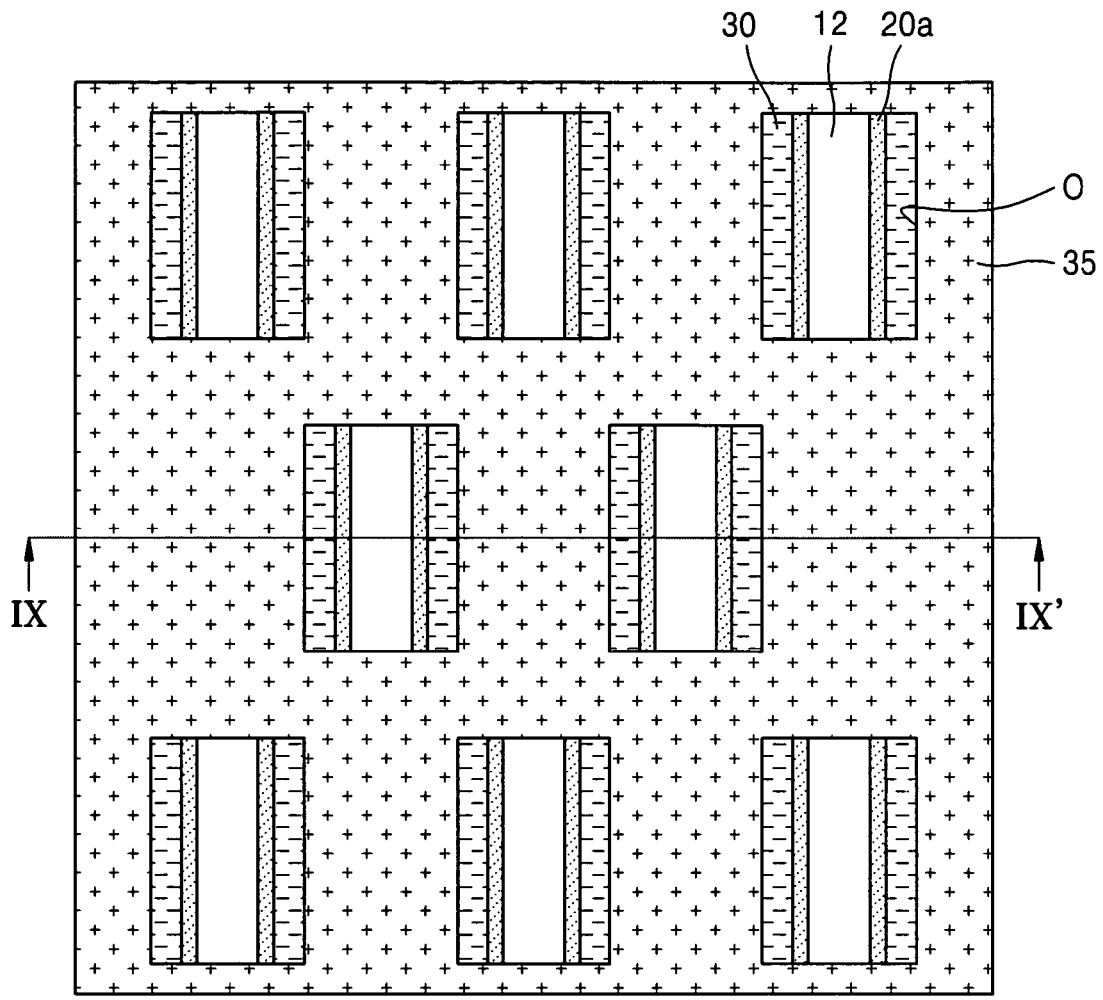
Figure 9:
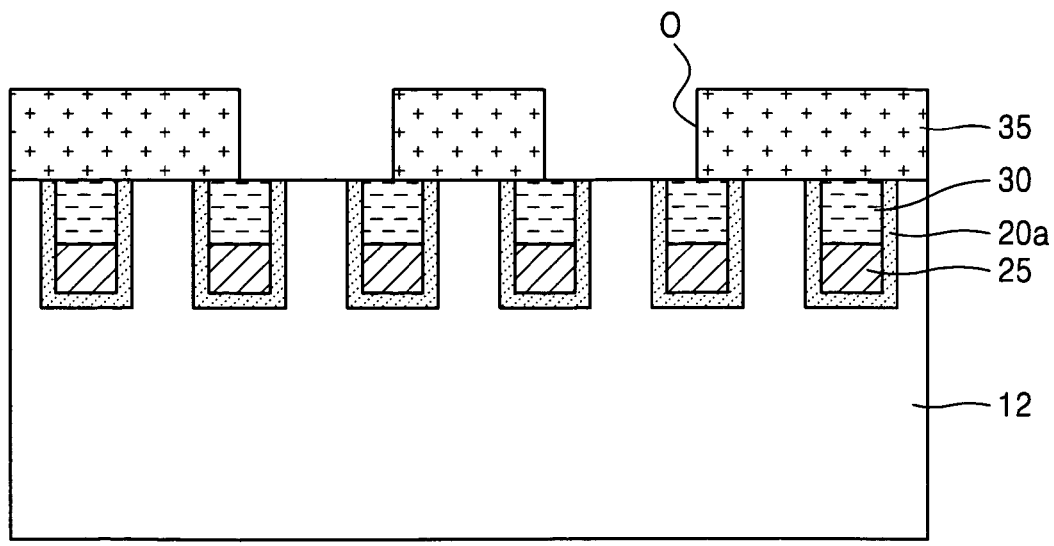

FIG. 7 is a plan view of the resultant structure in which the bit line 25 and an isolation layer 45 are formed, FIG. 8 is a plan view of the resultant structure on which a photoresist pattern 35 is used to form the isolation layer 45, and FIGS. 9 through 11 are cross-sectional views taken along line IX-IX' of FIG. 7 for illustrating a process of forming the isolation layer 45 of FIG. 7. Here, FIG. 9 is also a cross-sectional view taken along line IX-IX' of FIG. 8. The process is used to form the isolation layer 45 in the substrate 12 and to define an active region. The active region corresponds to a region of the substrate 12 excluding the isolation layer 45.

Referring to FIGS. 8 and 9, to form the isolation layer (45 of FIG. 7), a photoresist pattern 35 is formed using a photolithography process on the substrate 12 where the bit line capping layer 30 is formed. The photoresist pattern 35 has a contact-type opening O, which exposes a portion of the substrate 12 where an isolation layer will be formed. The photoresist pattern 35 is formed in the same manner as when a contact hole is formed. If the photoresist pattern 35 is formed as a contact type, since an active region pattern of the cell region, which has the smallest pitch and is the most complicated, can be formed as a simple contact type, controlling of the CD is easy and the pattern fidelity is improved. Also, a process margin can be increased by applying an optimized illumination system to the core region in which pattern arrangement is less dense than in the cell region.

Substantially, portions of the substrate 12, which are covered by the photoresist pattern 35, function as the active regions, which can be partitioned at regular intervals by the bit lines, which are uniformly formed as line-and-space type patterns. Thus, the active region can be uniformly formed, thereby improving the electrical characteristics of devices that will be formed on the active regions.

Figure 10:
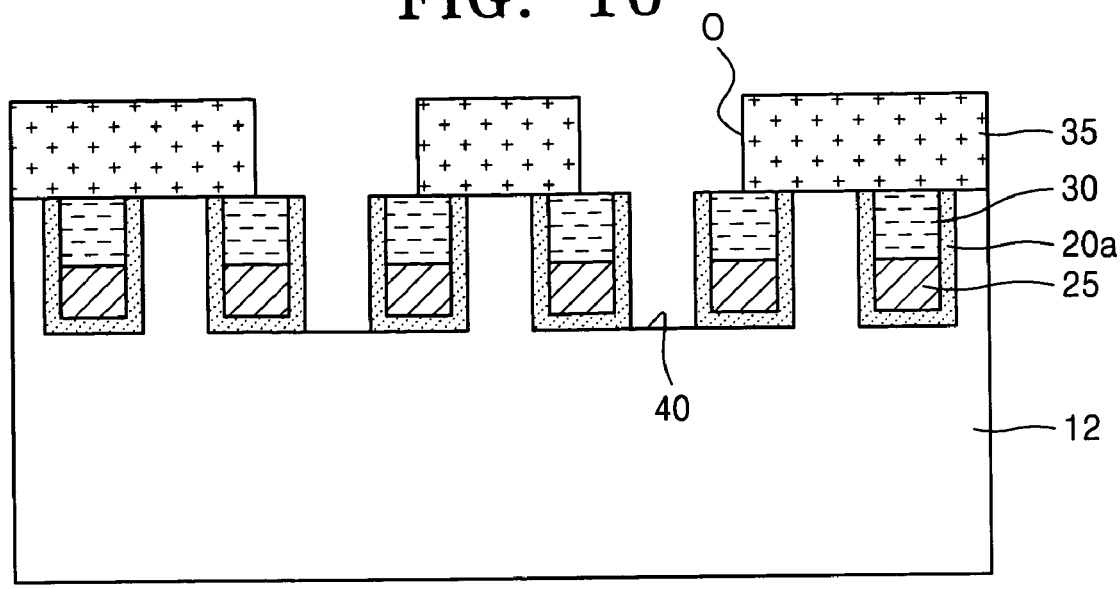

Referring to FIG. 10, a groove 40 for isolation is formed by etching the substrate 12 exposed by the photoresist pattern 35. If the bit line capping layer 30 and the liner insulating pattern 20a are formed, the substrate 12 is etched under process conditions that have an etch selectivity with respect to the bit line capping layer 30 and the liner insulating pattern 20a. For example, if the bit line capping layer 30 is a silicon oxide layer or a silicon nitride layer and the substrate 12 is a silicon substrate, the substrate 12 can be selectively etched with respect to the bit line capping layer 30 using dry etching with a mixture of oxygen and halogen gas such as HBr or $Cl_2$. The groove 40 for isolation can be formed deeper than or as deep as the trench 15, which is formed with reference to FIG. 4 to bury the bit line 25. Preferably, the depth of the groove 40 for isolation is controlled so as to obtain a sufficient insulation effect in consideration of the design rule of devices, pattern pitch, operating voltage and current level of the devices. However, unless there are other problems, it is convenient to form the groove 40 for isolation as deep as the trench 15 since the same process conditions can be used as when the trench 15 is formed.

Figure 11:
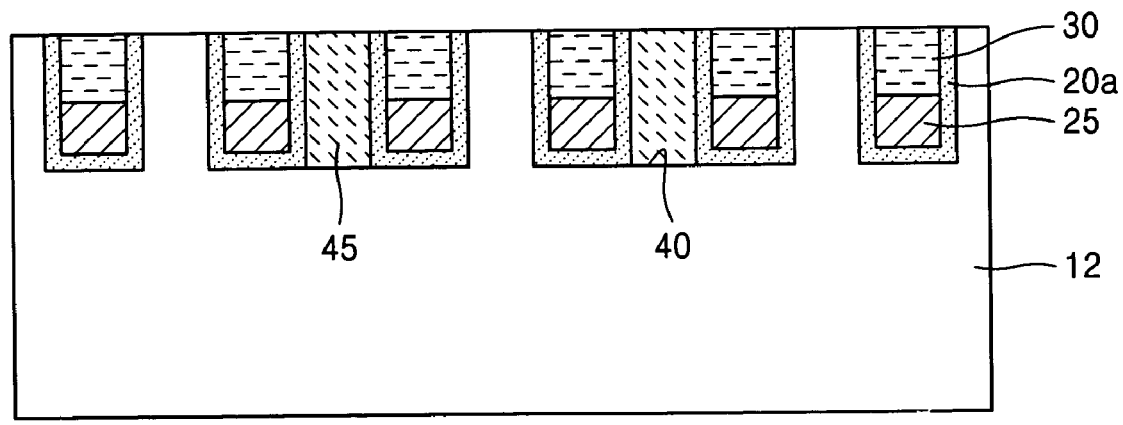

Thereafter, the photoresist pattern 35 is removed, and a silicon oxide layer is deposited to fill the groove 40 for isolation and planarized using etchback or CMP, thereby forming the isolation layer 45 as shown in FIG. 7. This process step is illustrated in FIG. 11.

Figure 12:
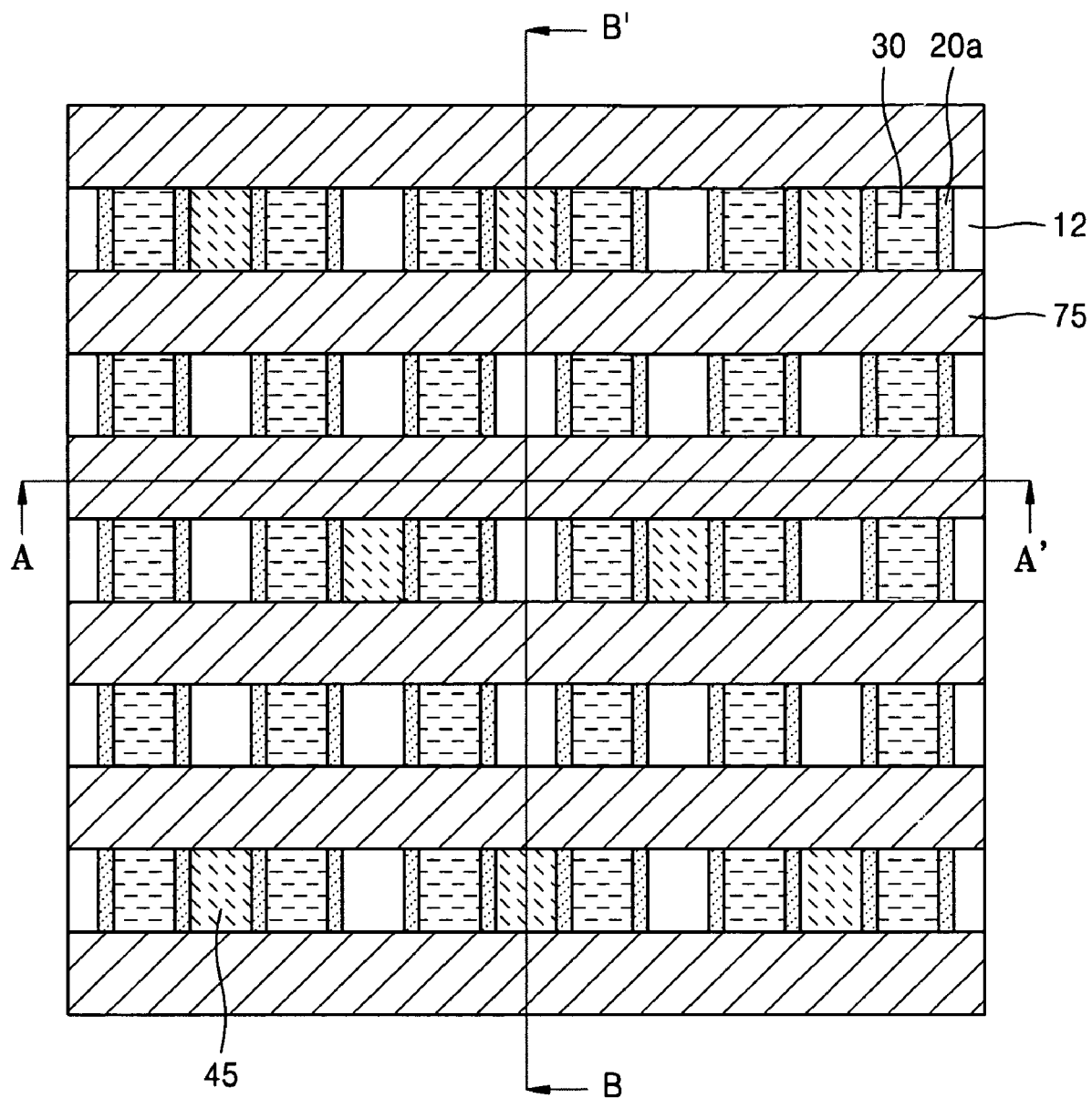

FIG. 12 is a plan view of the resultant structure where the isolation layer 45 and a gate line 75 are formed. The gate line 75 is formed to extend at a right angle to the bit line 25 across the active region. Before the gate line 75 is formed, an impurity ion implantation process for a typical transistor structure may be performed.

Figure 13:
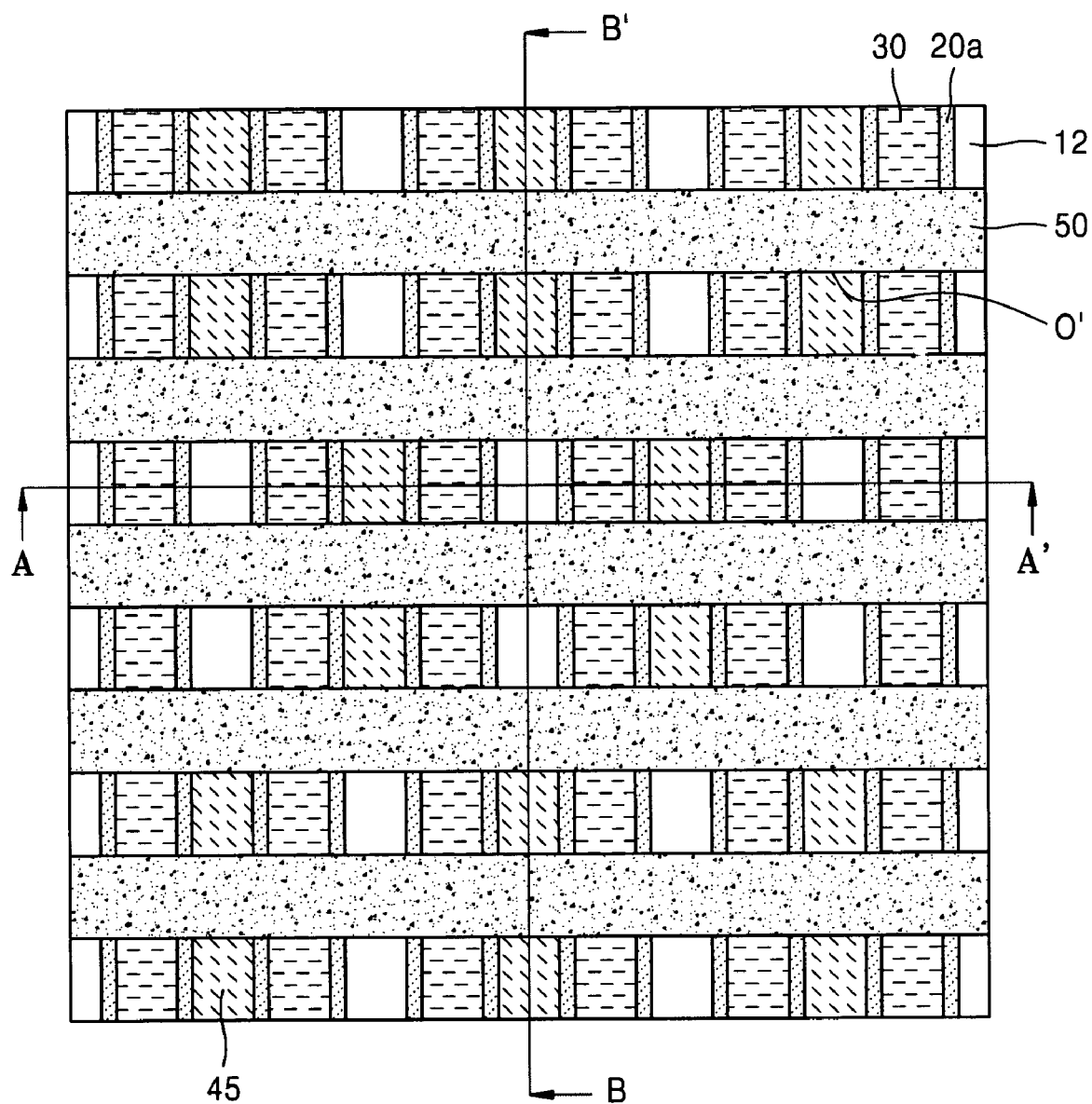
Figure 14A:
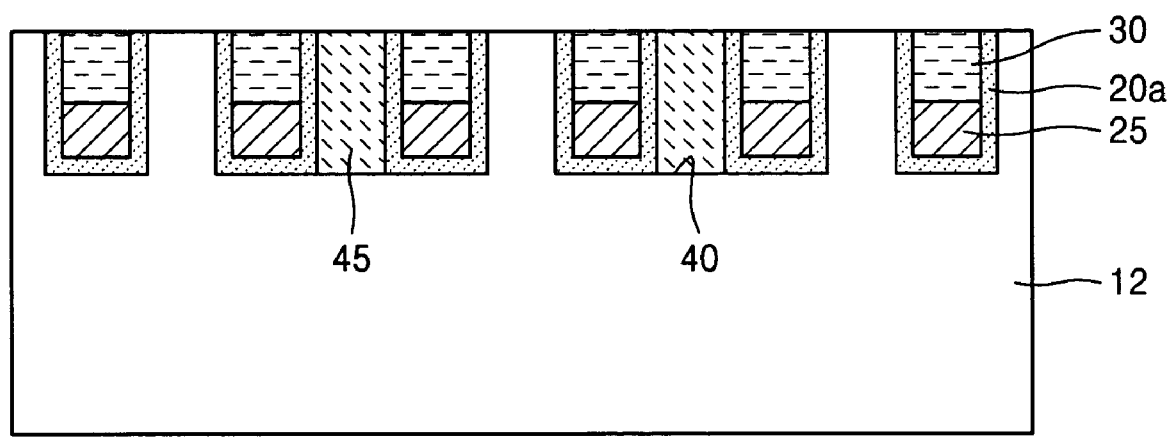
Figure 14B:
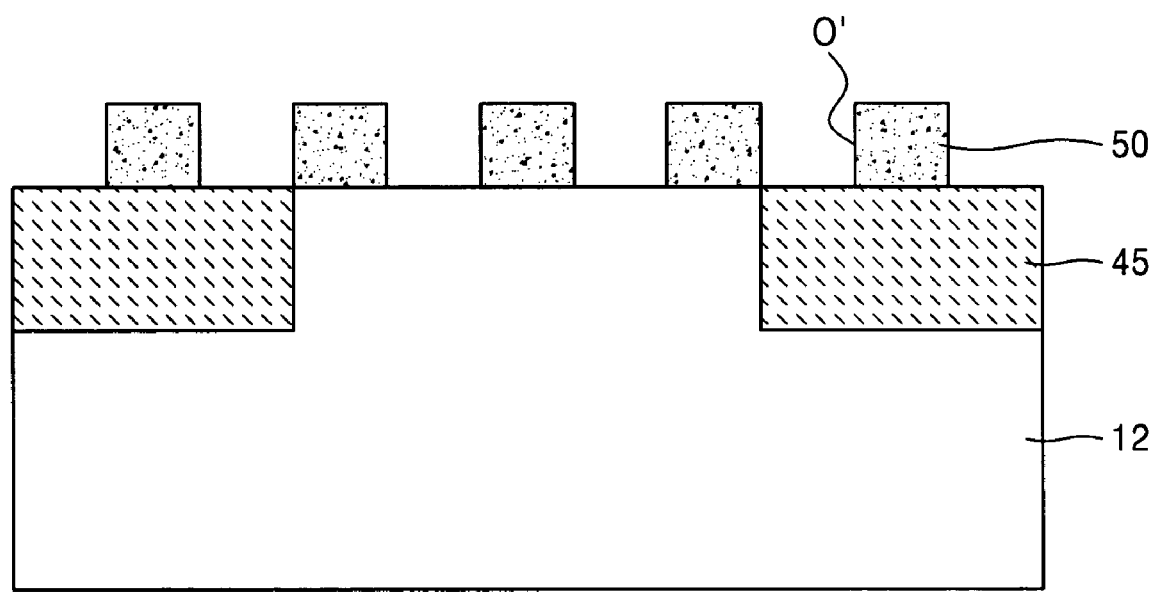
Figure 15A:
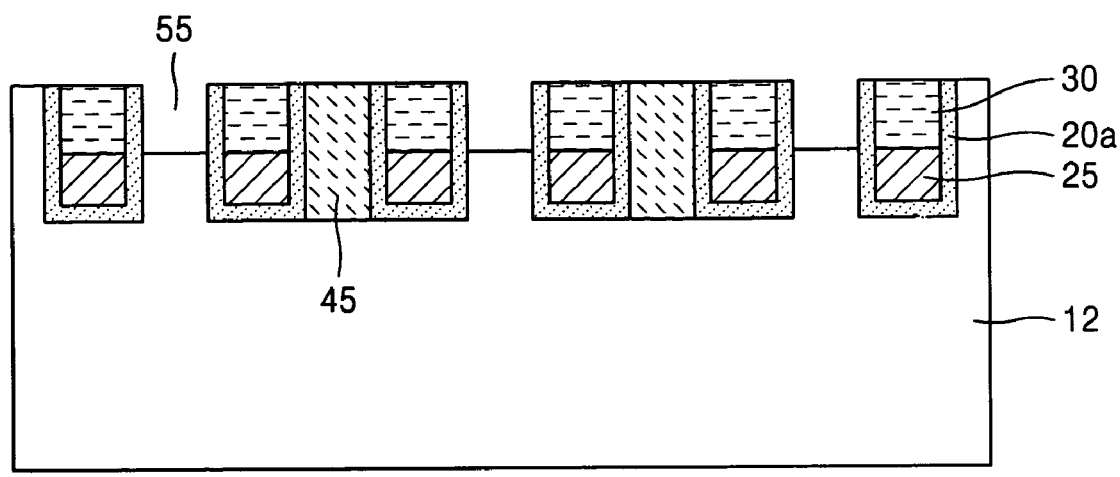
Figure 15B:
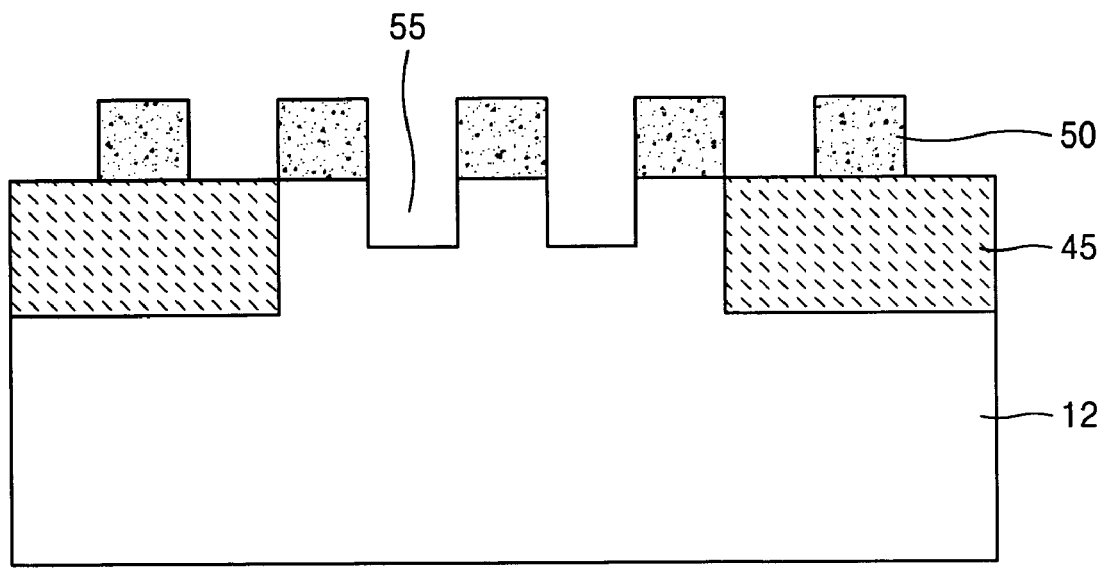
Figure 16A:
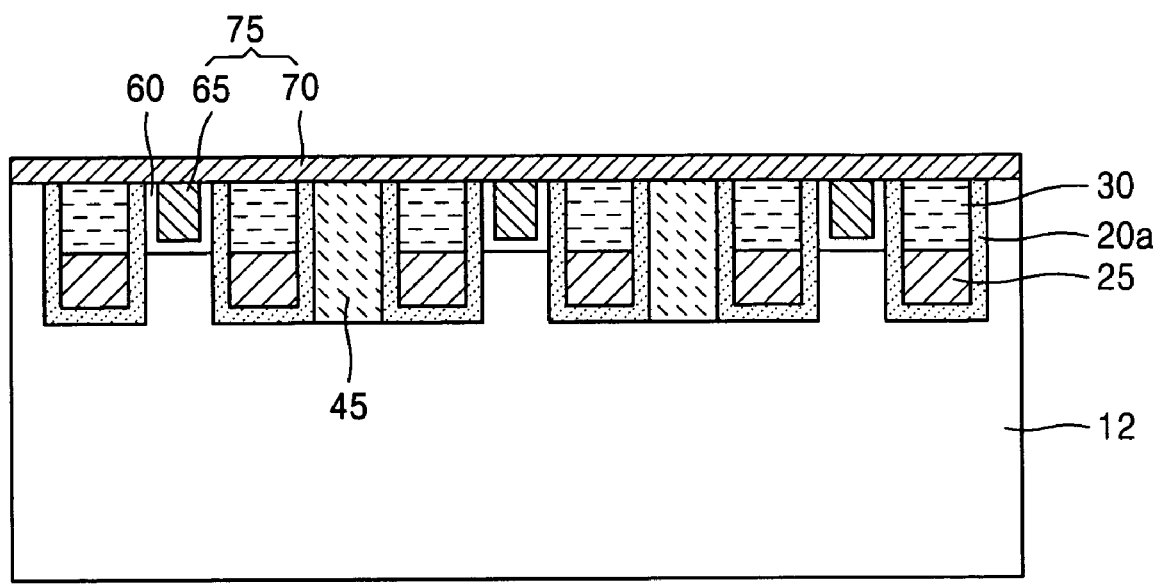
Figure 16B:
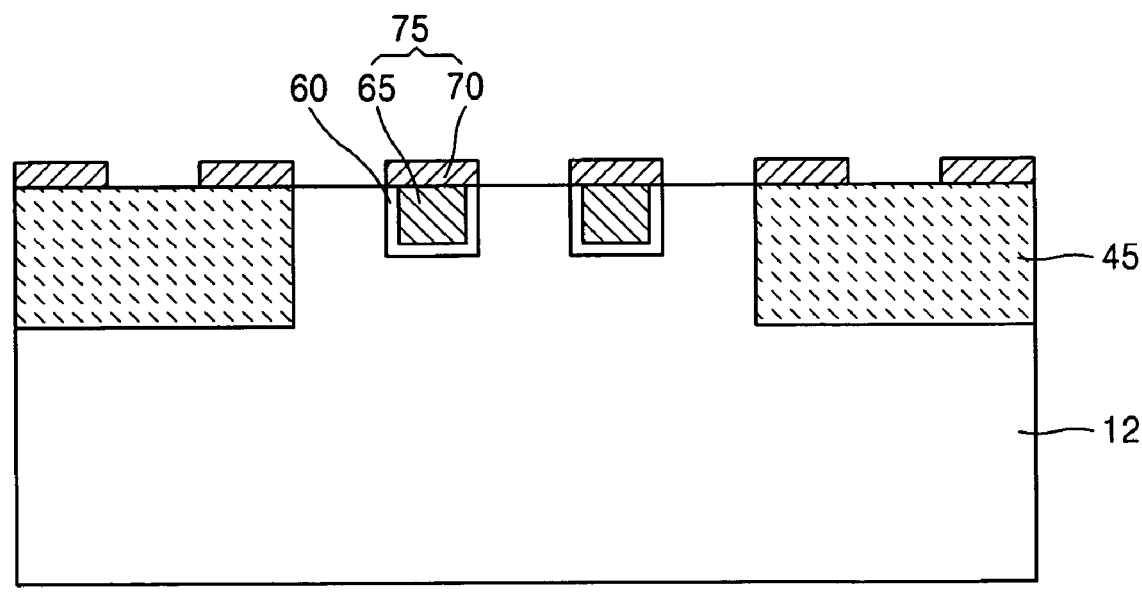

FIG. 13 is a plan view of the resultant structure on which a photoresist pattern 50 is used to form the gate line 75. FIGS. 14A, 15A, and 16A are cross-sectional views taken along line A-A' of FIG. 12 for illustrating a process of forming the gate line 75. FIGS. 14B, 15B, and 16B correspond to FIGS. 14A, 15A, and 16A, respectively, and are cross-sectional views taken along line B-B' of FIG. 12. The process, illustrated in FIGS. 14A-16B, forms most of gate lines 75 in the substrate 12 such that little step difference occurs between the substrate 12 and the gate line 75.

Referring to FIGS. 13, 14A, and 14B, the photoresist pattern 50 is formed using a photolithography process on the substrate 12 in which the isolation layer 45 is formed. The photoresist pattern 50 has an opening O' that exposes a portion of the substrate 12 where the gate line (75 of FIG. 12) will be formed. The photoresist pattern 50 has a line-and-space shape, which extends at a right angle to the bit line 25 across the active region on the substrate 12. As described above, the line-and-space-type photoresist pattern 50 facilitates the controlling of CDs and improves the pattern fidelity.

Referring to FIGS. 15A and 15B, a groove 55 for a gate line is formed by etching a portion of the substrate 12 that is exposed by the photoresist pattern 50. Here, the substrate 12 is etched under process conditions that have an etch selectivity with respect to the bit line capping layer 30. If the liner insulating pattern 20a is formed, the substrate 12 is etched under process conditions that have an etch selectivity with respect to the liner insulating pattern 20a and the bit line capping layer 30. The groove 55 for the gate line can be formed to an appropriate depth considering a relationship between the groove 55 for the gate line and the bit line 25. For example, when it is anticipated that an electrical interference between the bit line 25 and the groove 55 for the gate line affects the operation of a device, the groove 55 for the gate line can be formed to be shallower than the bit line 25.

Referring to FIGS. 16A and 16B, the photoresist pattern 50 is removed, and a gate oxide layer 60 is formed on the inner walls of the groove 55 for the gate line. The gate oxide layer 60 can be formed by depositing a thin oxide layer or growing an oxide layer using thermal oxidation. Next, a gate conductive layer is formed to fill the groove 55 for the gate line and planarized using etchback or CMP until the substrate 12 is exposed, thereby forming a gate pattern 65. The gate conductive layer for the gate pattern 65 can be formed of various conductive materials, such as doped polysilicon, a metal such as tungsten, or a metal silicide such as tungsten silicide. In the drawings, the bottom of the gate pattern 65 is formed higher than a top surface of the bit line 25 by forming the groove 55 for the gate line to be shallower than the bit line 25. However, as described above, the top surface of the bit line 25 can be formed higher or lower than the bottom of the gate pattern 65 considering the electrical characteristics of a device.

Next, a conductive material for connecting gates is deposited on the entire surface of the substrate 12, and a pattern (not shown) opposite to the photoresist pattern 50 shown in FIG. 13 is formed on the conductive material for connecting the gates, so as to transmit electric signals to the gate pattern 65 formed in the substrate 12. The conductive material for connecting the gates is etched using the pattern (not shown) as an etch mask. Then, if the pattern (not shown) is removed, the gate line 75 is formed. Each gate line 75 includes a gate pattern 65 connected to the conductive line 70, which is disposed at a right angle to the bit line 25. The conductive material for connecting gates can be formed of the same material as the gate conductive layer, for example, a doped polysilicon, a metal such as tungsten, or a metal silicide such as tungsten suicide or a different material from the gate conductive layer.

In this case, since a substantial portion of each gate line 75 constituting a transistor is formed in the substrate 12, as long as electric signals are uniformly transmitted, a step difference between the substrate 12 and the conductive lines 70 can be reduced. Accordingly, an aspect ratio (or a stack height) of the gate line 75 can be reduced, thus facilitating subsequent processes, such as gap filling, contact etching, and the like.

Since the gate conductive layer and the conductive material for connecting the gates can be formed of the same material, the gate conductive layer and the conductive material can be integrally formed instead of separately forming the same. To perform the integrated process, after the gate conductive layer is deposited, a planarization process for forming the gate pattern 65 is omitted or the gate conductive layer is planarized to an appropriate thickness for forming the conductive line 70 in a subsequent step using the remaining conductive layer. Next, the remaining gate conductive layer is patterned in the shape of a conductive line 70. Thus, the gate line 75, in which the gate pattern 65 and the conductive line 70 are integrally formed, is completed.

Figure 17:
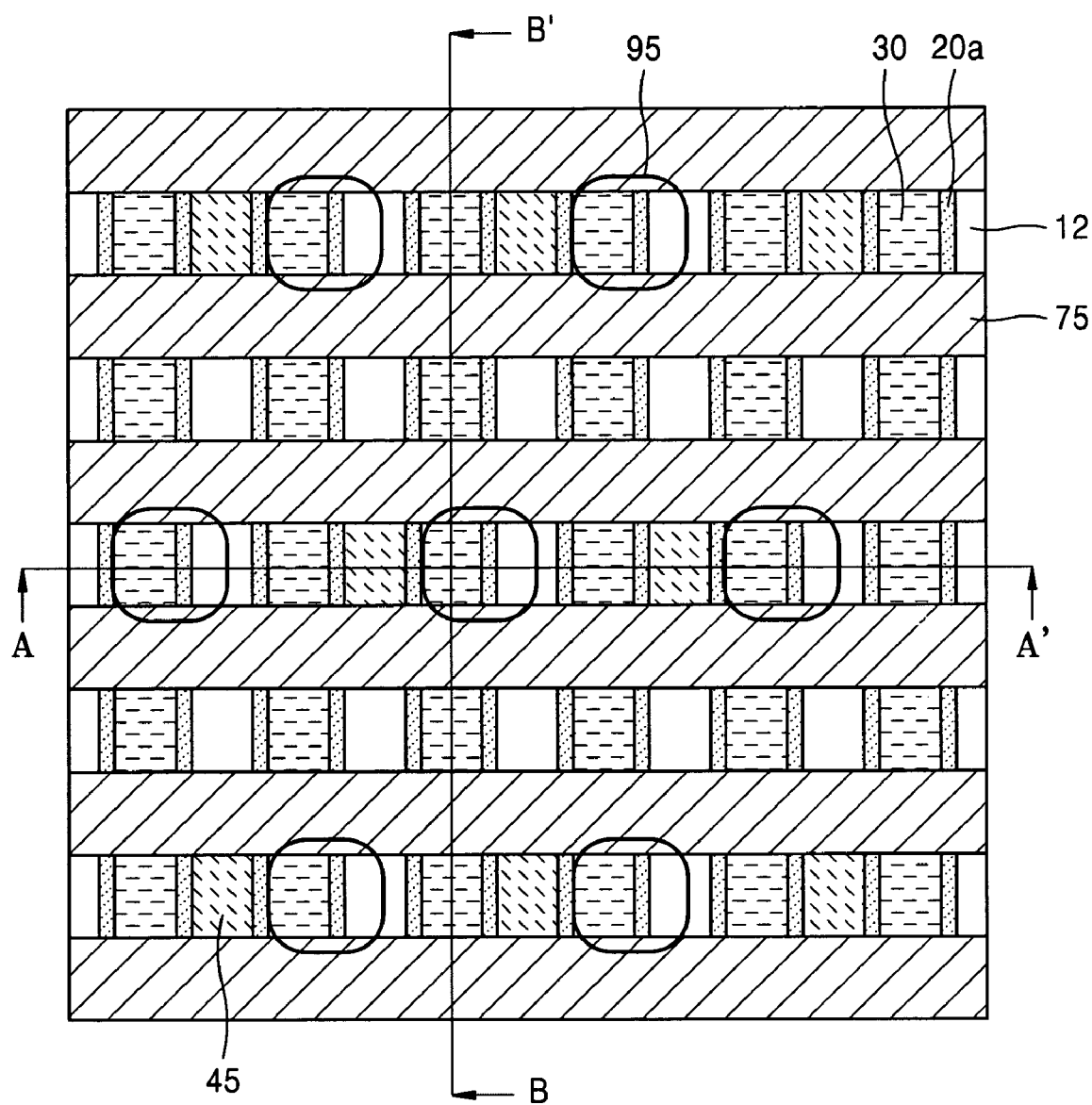

FIG. 17 is a plan view of the resultant structure, in which the gate line 75 is formed, for illustrating a position where a bit line contact plug 95 will be formed. FIGS. 18A, 19A, 20A, and 21A are cross-sectional views taken along line A-A' of FIG. 17 for illustrating a process of forming the bit line contact plug 95 of FIG. 17. FIGS. 18B, 19B, 20B, and 21B correspond to FIGS. 18A, 19A, 20A, and 21A, respectively, and are cross-sectional views taken along line B-B' of FIG. 17.

In conventional DRAMs, since a bit line is disposed over a gate line, a bit line contact plug is formed over the gate line. However, in the present invention, after the active region and the bit line are exposed at the same time using selective etching, a conductive material is deposited, such that the bit line is connected to the active region disposed thereunder.

Figure 18A:
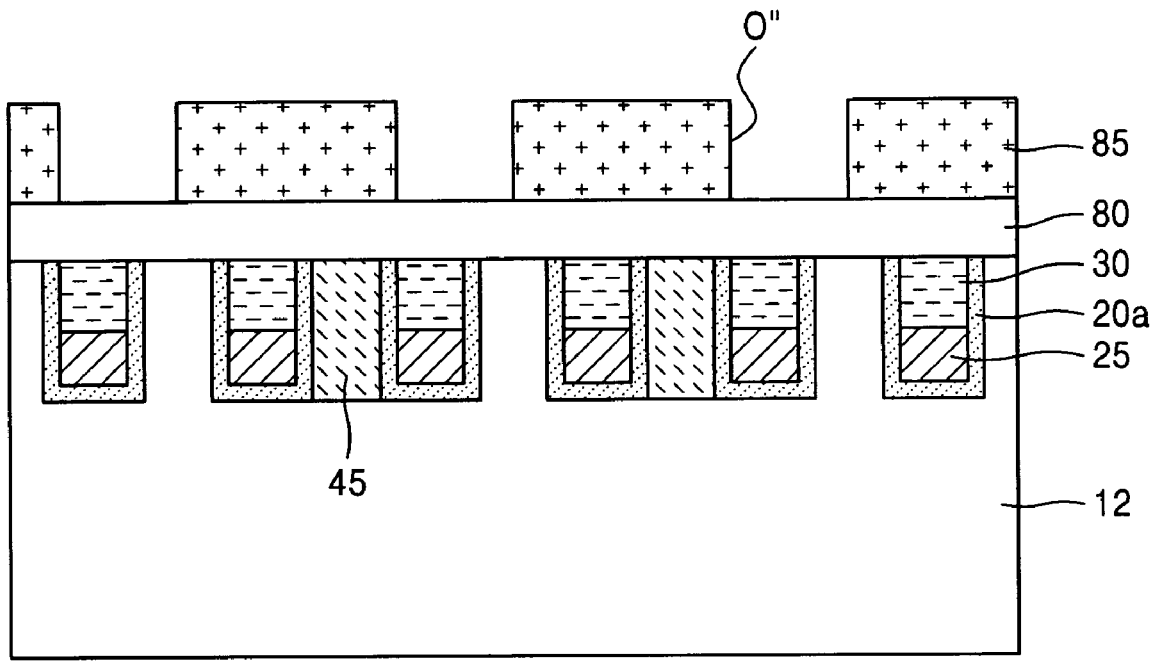
Figure 18B:
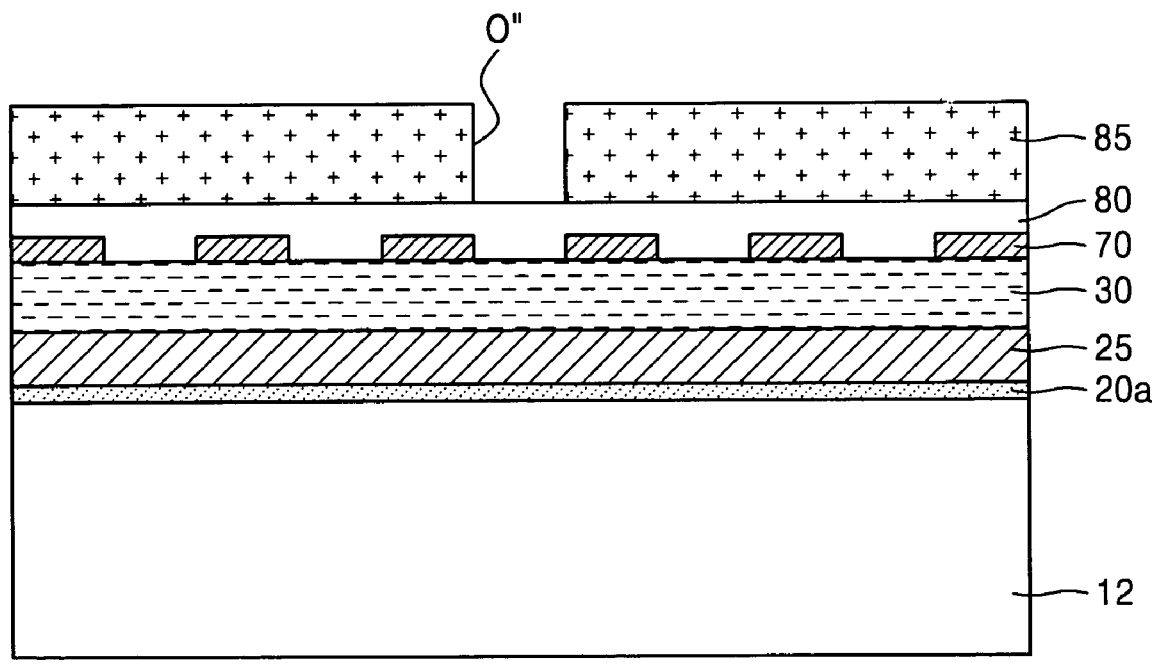

Referring to FIGS. 18A and 18B, an interlayer dielectric (ILD) 80, such as an oxide layer, is formed on the conductive line 70 of the gate line (75 of FIG. 16A) to electrically isolate the conductive line 70. The ILD 80 is then planarized. Thereafter, a photoresist pattern 85 is formed on the substrate 12 to form the bit line contact plug (95 of FIG. 17). The photoresist pattern 85 has an opening O" at a position where a bit line contact plug will be formed. The opening O" can expose the bit line capping layer 30 and the active region around a position where the bit line contact plug will be formed.

Figure 19A:
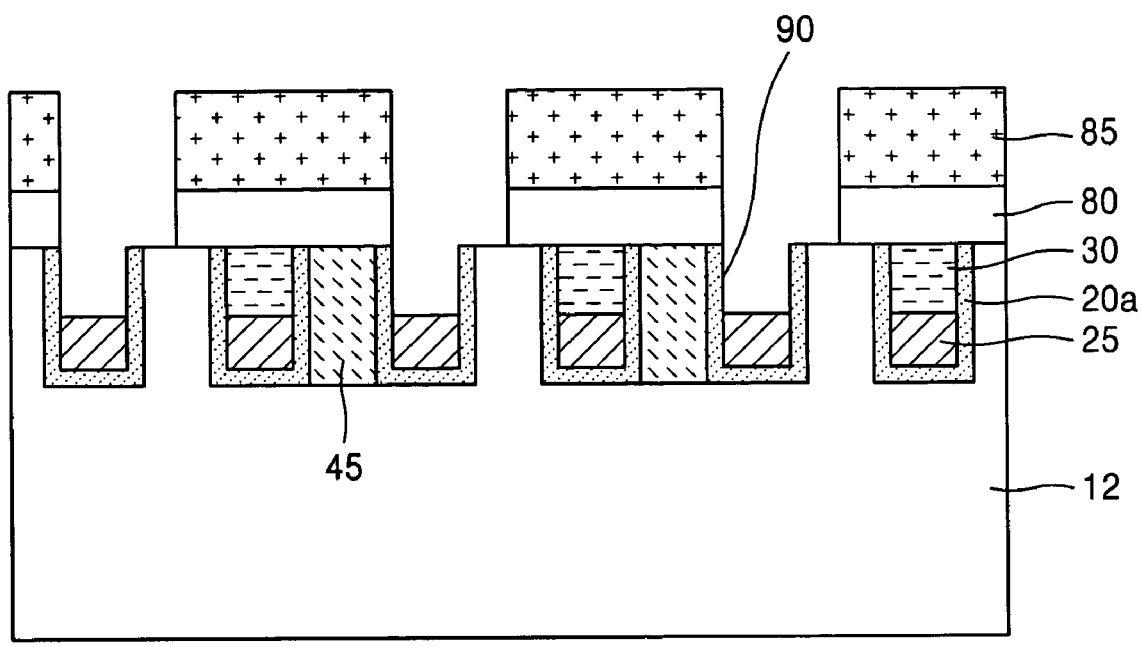
Figure 19B:
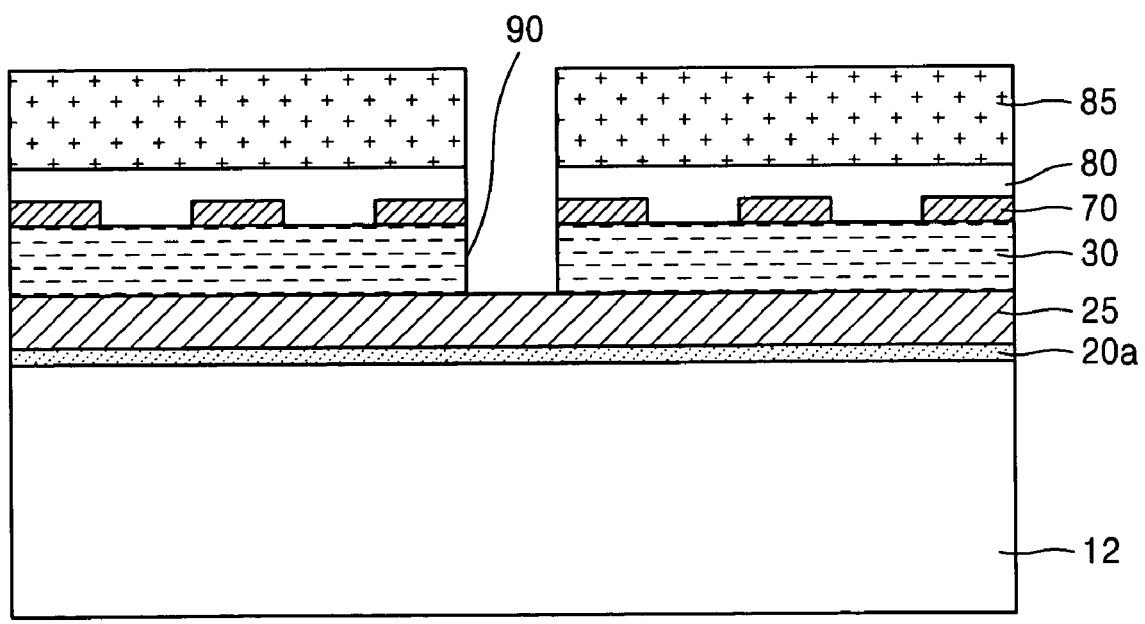

Referring to FIGS. 19A and 19B, the ILD 80 and the bit line capping layer 30 are selectively etched until the active region and the bit line 25 are exposed, thereby forming a bit line contact hole 90.

Figure 20A:
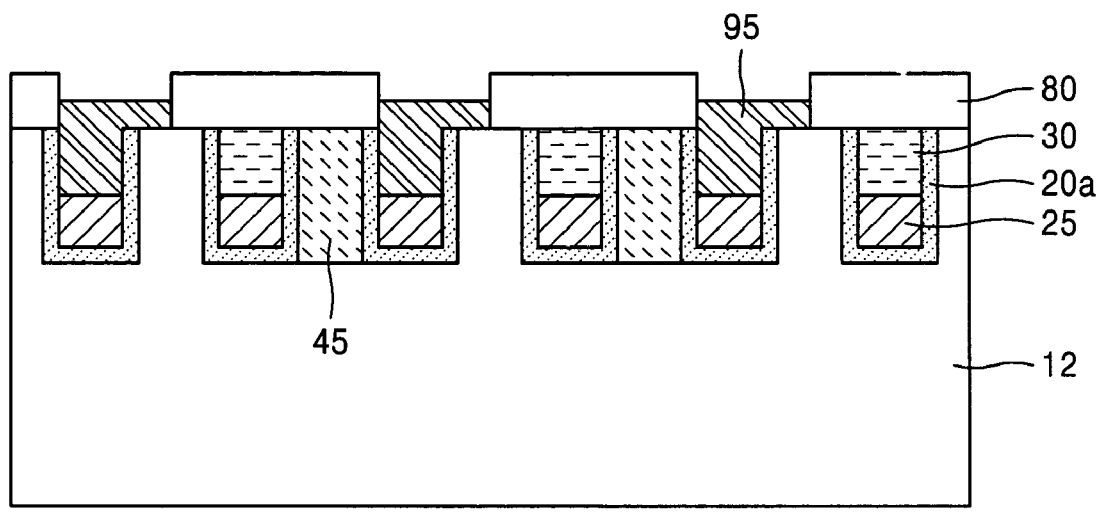
Figure 20B:
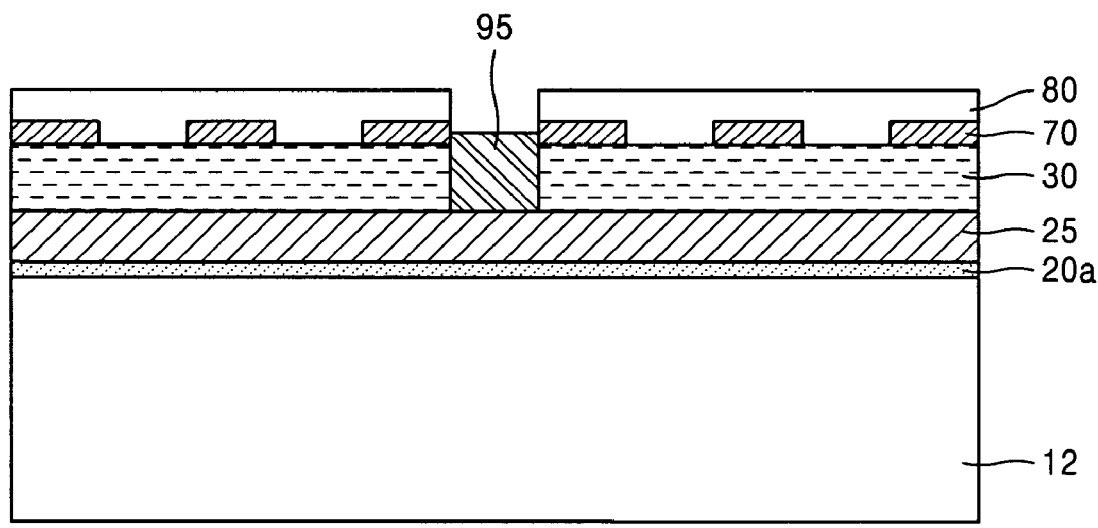

FIGS. 20A and 20B are cross-sectional views of the resultant structure where the bit line contact plugs 95 are formed. To form the bit line contact plug 95 shown in FIGS. 20A and 20B, a contact conductive material is deposited in the bit line contact hole 90. In addition, the contact conductive material connects to the bit line 25 and the substrate 12. The contact conductive material is recessed using etchback or the like to form the bit line contact plug 95. Here, the gate line 75 can be electrically isolated from the bit line contact plug 95 by performing a process of forming spacers (not shown) before the conductive material is deposited. If the liner insulating pattern 20a is formed of silicon nitride, while the bit line contact hole 90 is being formed, the liner insulating pattern 20a is not etched and remains within the bit line contact hole 90, thereby insulating the bit line 25 from a section of the active region. However, if the liner insulating pattern 20a is formed of silicon oxide, while the bit line contact hole 90 is being formed, the liner insulating pattern 20a is etched and removed. Accordingly, the spacer forming process can be performed before the conductive material is deposited, thereby insulating the bit line 25 from the active region.

Also, the bit line contact plug 95 can be formed to be lower than the conductive line 70 of the gate line 75 by controlling the time taken to perform the etchback process. This enables the overlay margin to greatly increase during a subsequent process of forming a storage node. Also, since a storage node contact plug is not formed on the bit line unlike in the conventional DRAMs, a bit line hard mask used for etching a storage node contact hole is not required. Thus, the bit line in the core region can be easily etched.

Figure 21A:
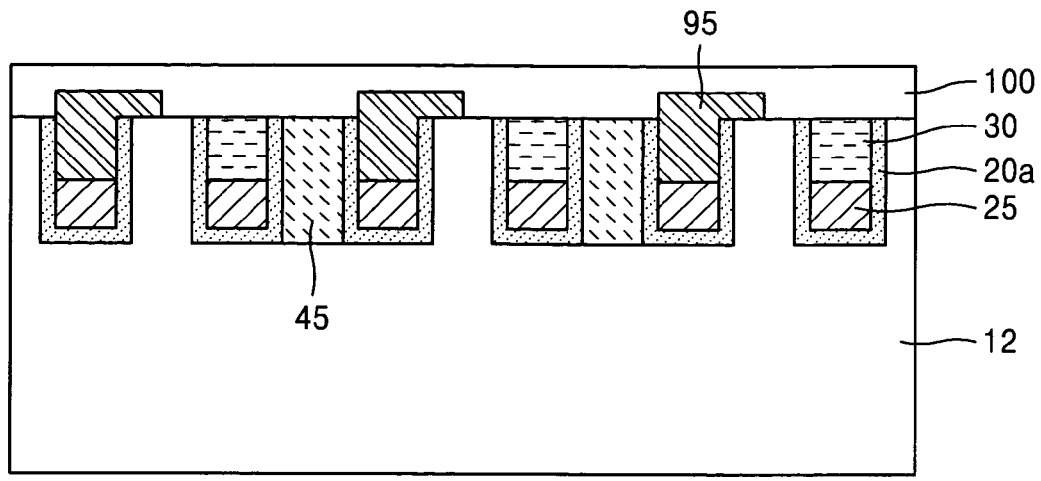
Figure 21B:
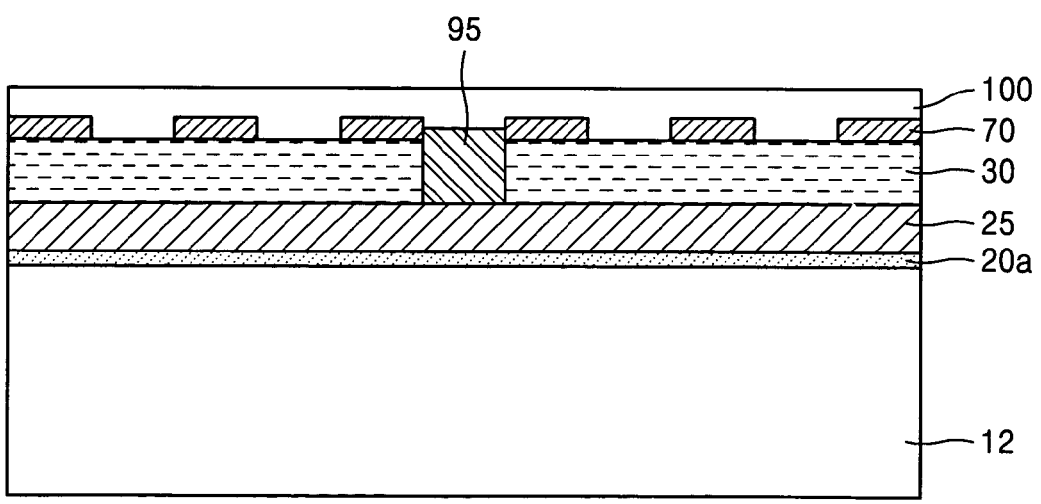

FIGS. 21A and 21B are cross-sectional views of the resultant structure in which the bit line contact plug 95 is buried in an ILD 100. To form the ILD 100, an insulating material, such as an oxide layer, is deposited on the bit line contact plug 95 and planarized.

Figure 22:
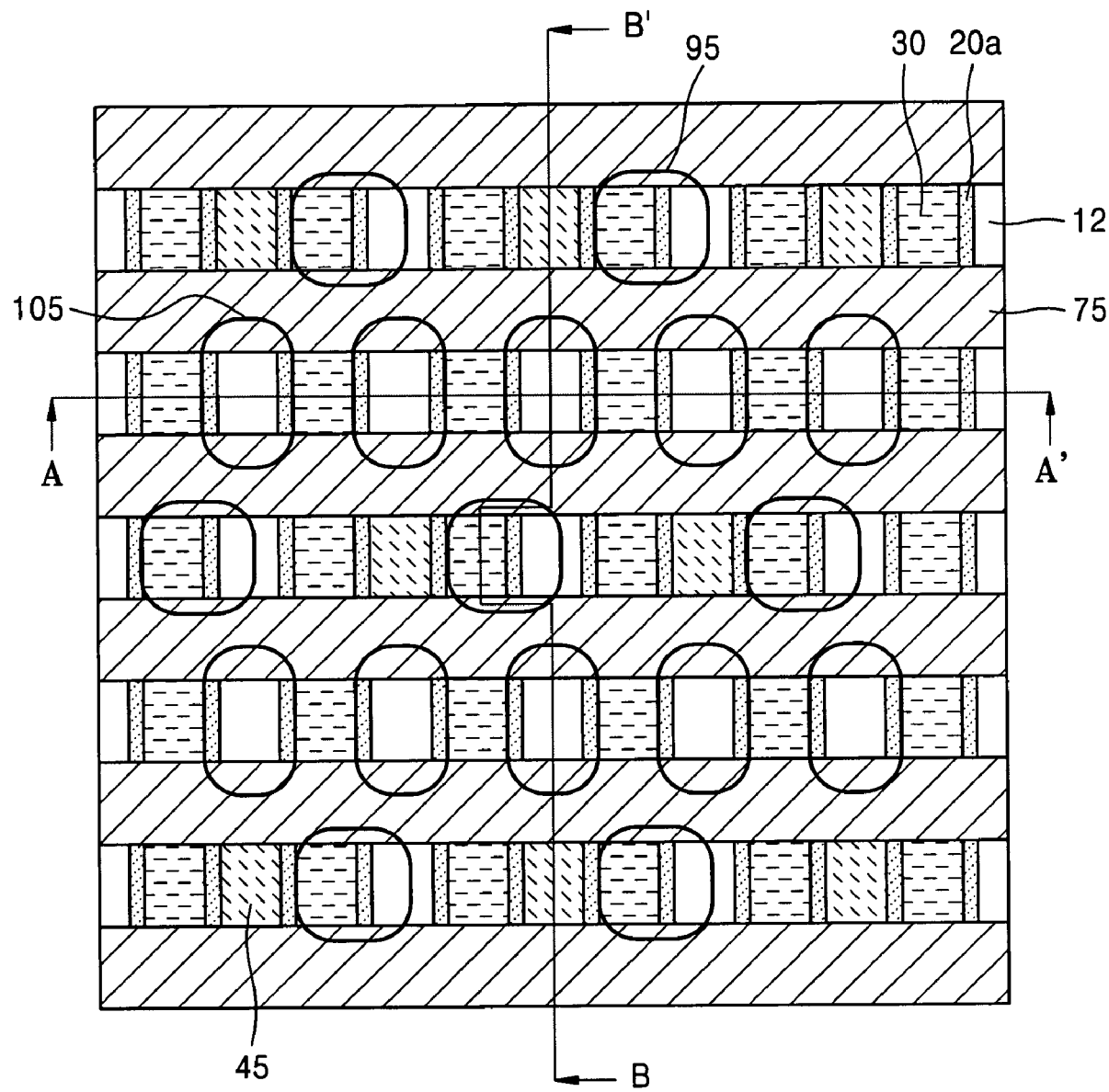
Figure 23A:
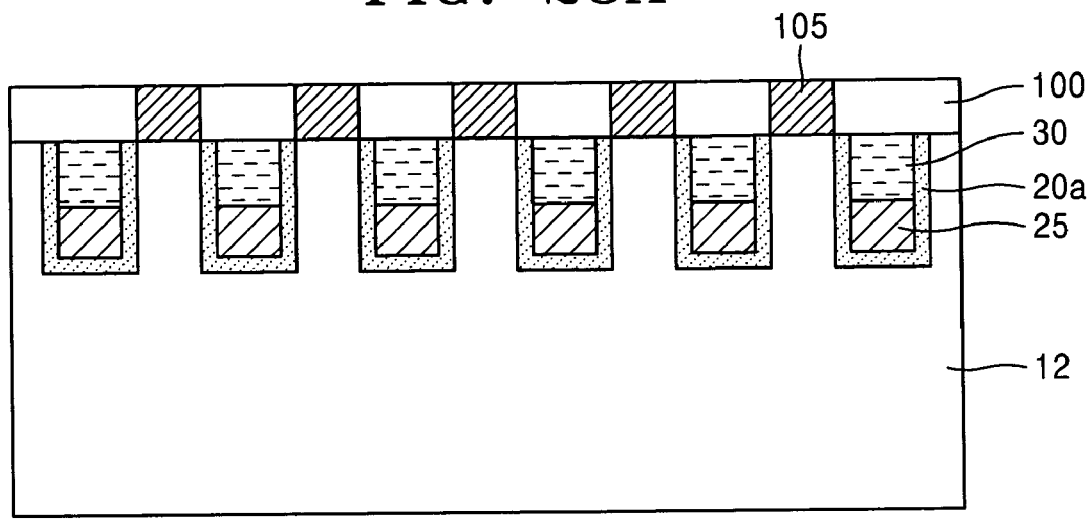
Figure 23B:
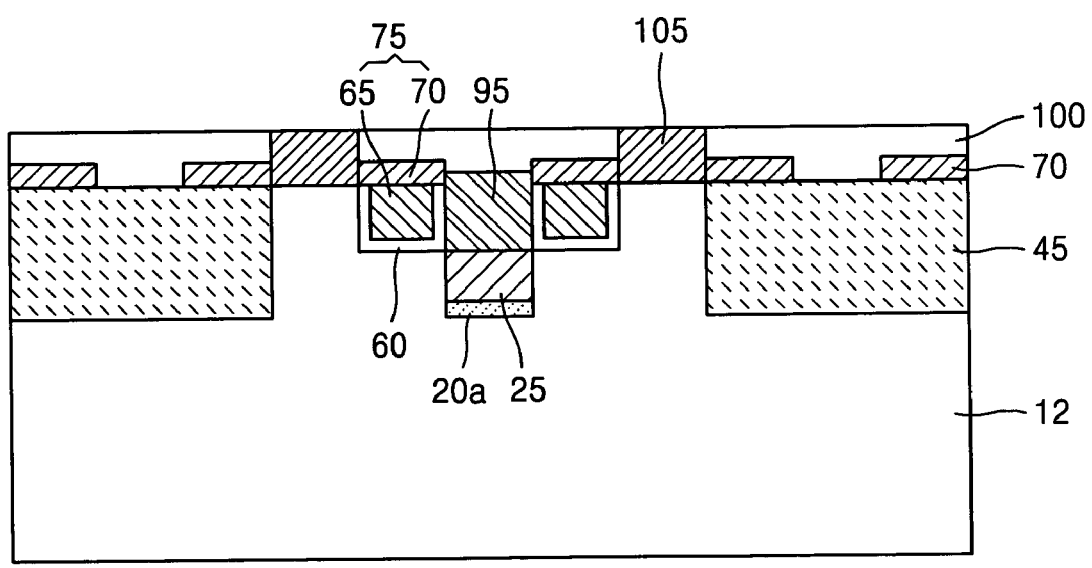
Figure 24:
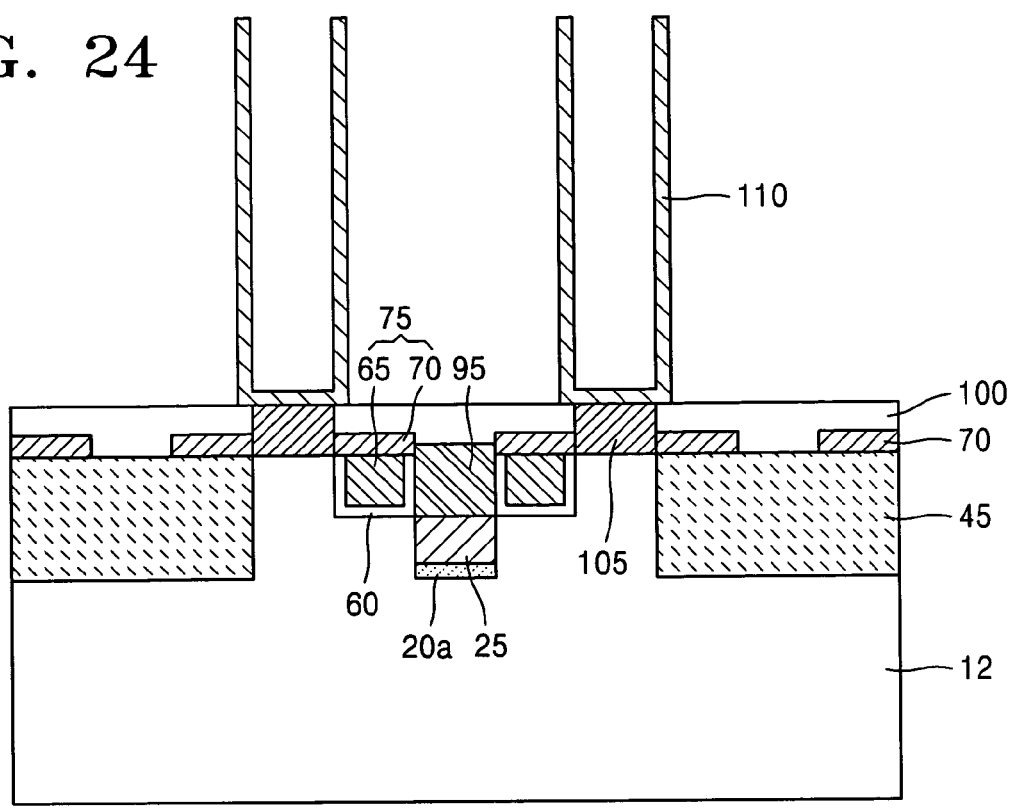

FIG. 22 is a cross-sectional view for illustrating a position where the storage node contact plug 105 will be formed, FIG. 23A is a cross-sectional view taken along line A-A' of FIG. 22, and FIG. 23B is a cross-sectional view taken along line B-B' of FIG. 22. The storage node contact plug 105 can be electrically isolated from the gate line 75 by an appropriate process of forming spacers (not shown). FIG. 24 is a cross-sectional view of the resultant structure where a storage node 110 is formed on the storage node contact plug 105 buried in the ILD 100.

As described above with reference to FIGS. 1 and 2, in the conventional DRAMs, the storage node contact plug 10 is formed between the gate 4 and the bit line 9, which are at a right angle to each other so that the storage node contact plug 10 is connected to the active region 2. Thus, since an overlay margin between the storage node contact plug 10 and the cell pad 6a is not sufficient, yield is reduced. However, in the present invention, since the bit line 25 is disposed under the active region, only an overlay margin between the storage node contact plug 105 and the gate line 75 is considered. In addition, when the stack height of a device is identical, the capacitance is increased in the present invention. Also, when the capacitance is identical, the height of the stacked device can be reduced. This facilitates a subsequent etch process required for metal interconnections.

Figure 2:
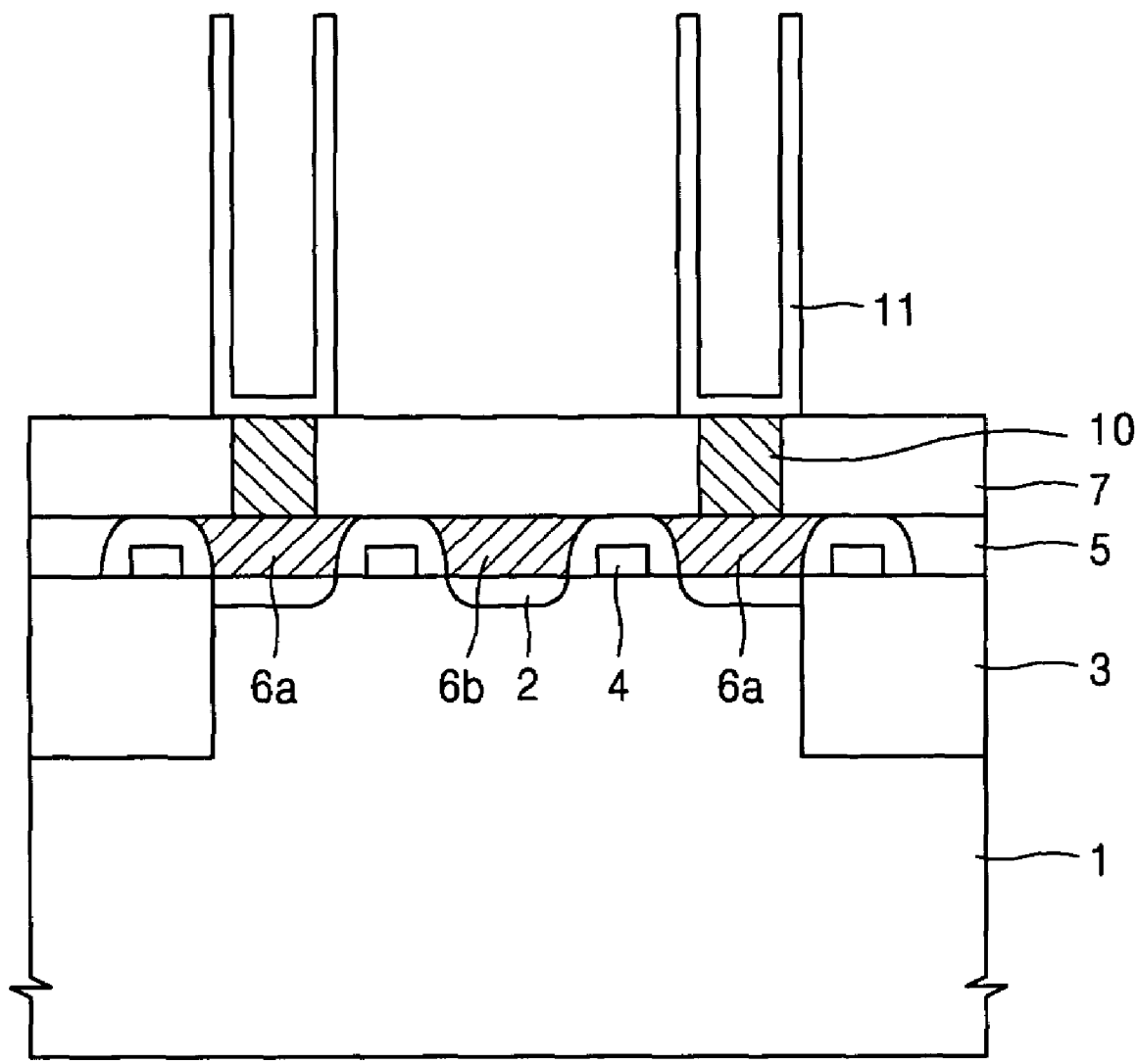
FIG. 2 is a cross-sectional view of the conventional DRAM, taken along line II-II' of FIG. 1.

Further, In the conventional structure as described with reference to FIGS. 1 and 2, two kinds of contact layers, i.e., the cell pad 6a and the storage node contact plug 10, are required to connect the active region 2 to the storage node 11, and the contact size is very small because these contact layers are formed between the gate 4 and the bit line 9. Thus, an increase in a resistance between the active region 2 and the storage node 11, significantly affects degradation of devices, and reduces yield.

Figure 25:
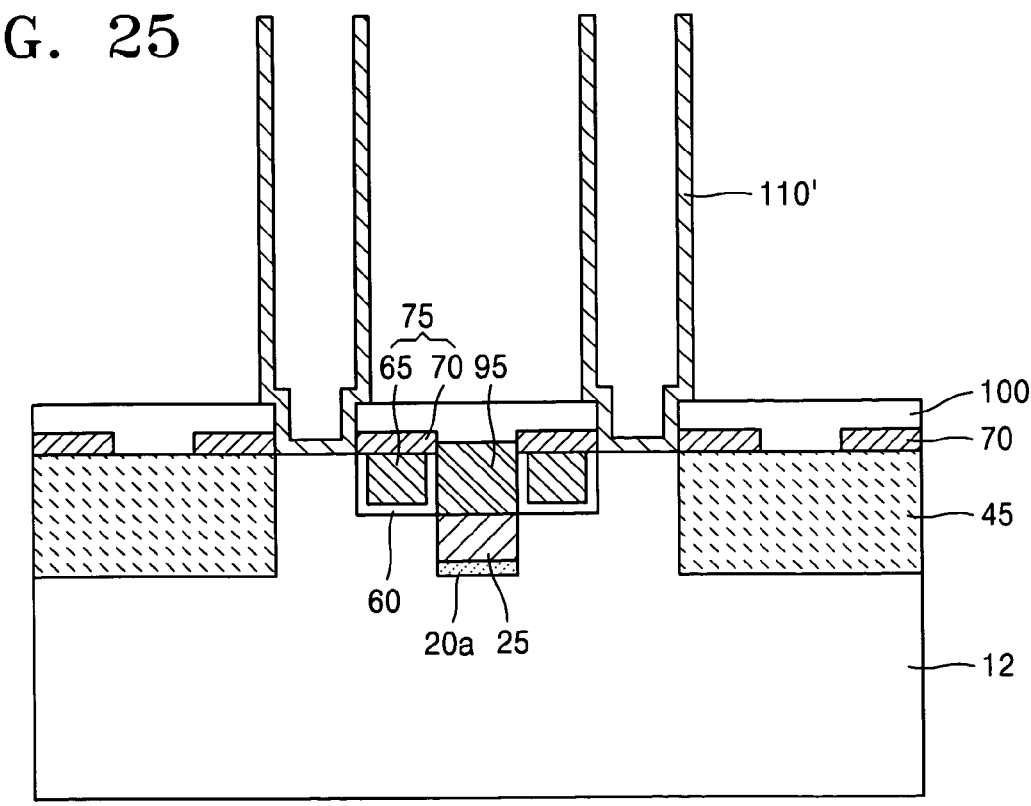
FIG. 25 is a cross-sectional view illustrating a method of manufacturing a semiconductor device according to another exemplary embodiment of the present invention.

However, referring to FIG. 25, a storage node 110' can be formed directly on the active region without a storage node contact plug (105 of FIG. 24), according to another exemplary embodiment of the present invention. Thus, the entire process is simplified and contact resistance can be greatly improved. Accordingly, when the stack height of a device is identical, the capacitance is increased in the present invention. Also, when the capacitance is identical, the height of the stacked device can be reduced. This facilitates a subsequent etch process required for metal interconnections.

Figure 26:
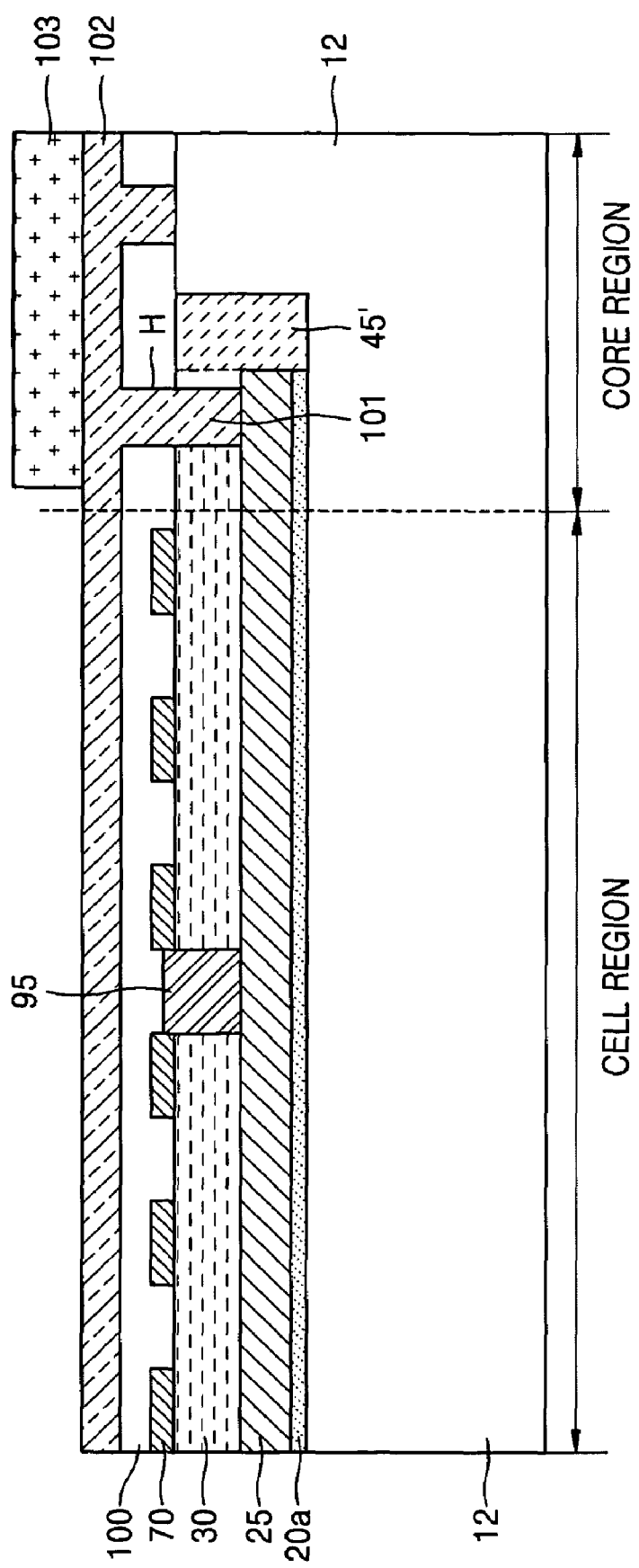
FIGS. 26 through 28 are cross-sectional views illustrating a method of manufacturing a semiconductor device according to yet another exemplary embodiment of the present invention.
Figure 27:
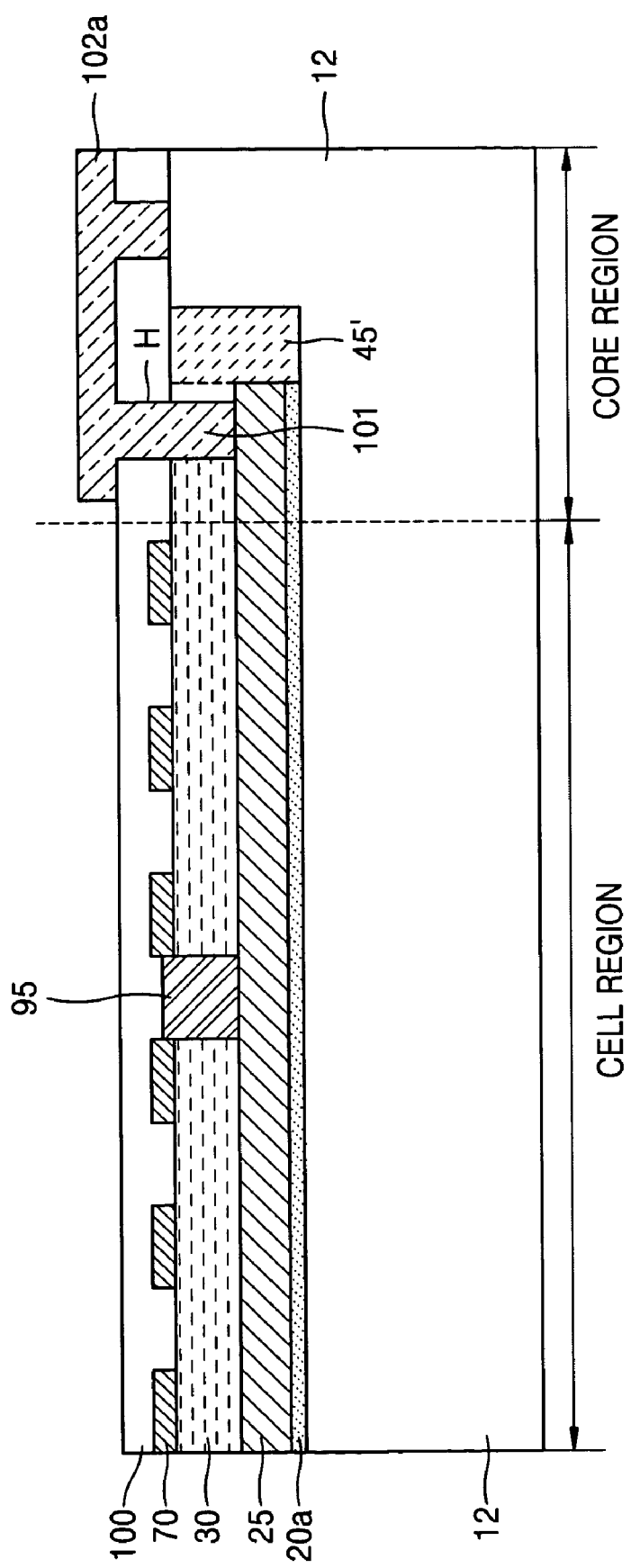
Figure 28:
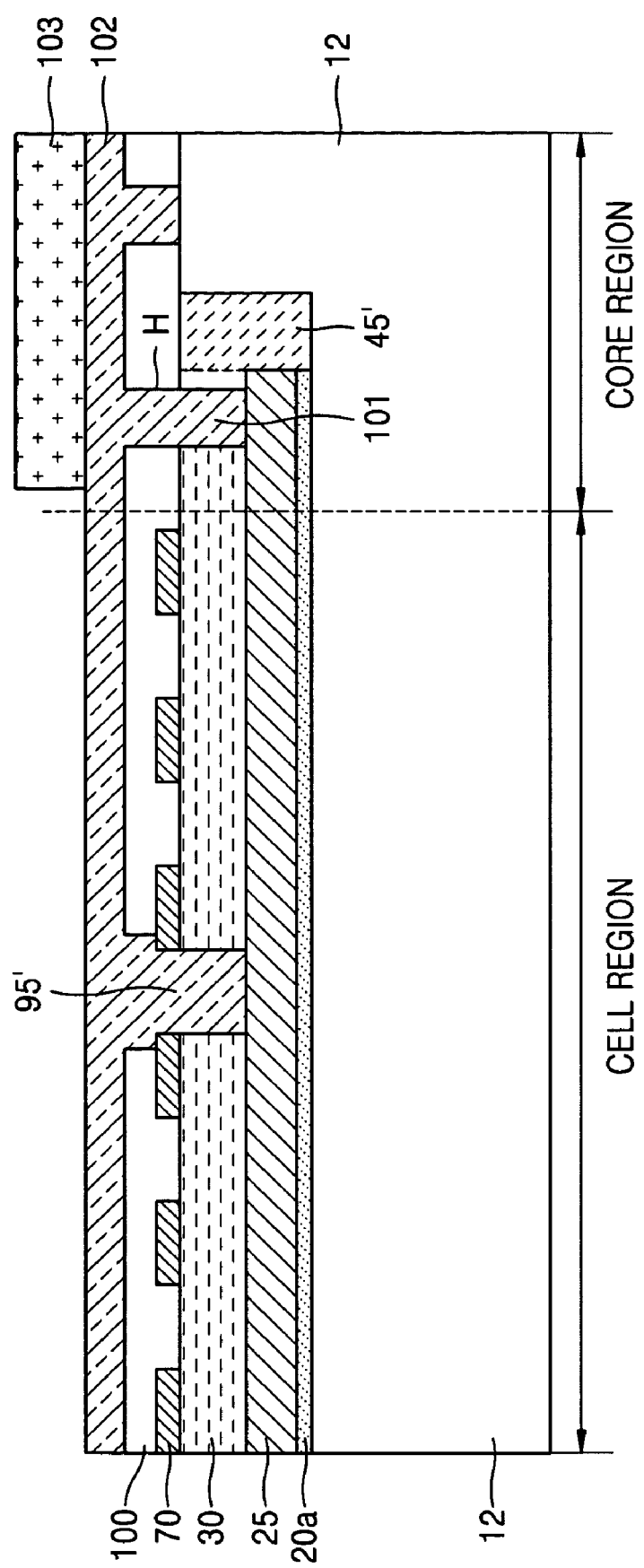

FIGS. 26 through 28 are cross-sectional views taken along line B-B' of FIG. 17, for illustrating a method of forming semiconductor device according to another exemplary embodiment of the present invention.

Referring to FIG. 26, a substrate 12 includes a cell region and a core region, and a bit line 25 is formed to partially overlap the core region. For this, in the process step described with reference to FIG. 4, trenches 15 are formed not only in the cell region but also in a portion of the core region. Also, when an isolation layer 45 is formed, a groove for isolation is formed at a portion of the substrate 12 where the bit line 25 comes to an end. In addition, the groove is filled with silicon oxide to form an isolation layer 45' so as to electrically isolate the bit line formed in the core region. Next, a bit line contact plug 95 and an ILD 100 are formed by subsequent processes.

Thereafter, a hole H is formed in the core region to form a bit line interconnection contact 101 connected to the bit line 25. A conductive material 102 for a bit line pattern is deposited using doped polysilicon to fill the hole H. A photoresist pattern 103 for a bit line pattern is formed. Next, the conductive material 102 for the bit line pattern is patterned using the photoresist pattern 103 as an etch mask, and then the photoresist pattern 103 is removed. As a result, as shown in FIG. 27, a bit line pattern 102a of the core region, which is connected to the bit line 25 of the cell region by the bit line interconnection contact 101, is formed.

It is exemplarily described here that the bit line interconnection contact 101 of the core region is additionally formed after the bit line contact plug 95 of the cell region is formed. However, the bit line interconnection contact 101 of the core region can be formed together with the bit line contact plug 95' of the cell region as shown in FIG. 28. When the bit line contact plug 95' of the cell region and the bit line interconnection contact 101 of the core region are simultaneously filled with a material forming the bit line pattern 102a using an integral interconnection process, the bit line contact plug 95' of the cell region can be formed to be lower than the gate line 75 without affecting the bit line pattern 102a of the core region using appropriate over-etching. Thus, the bit line contact plug 95 shown in FIG. 27 can be formed. Preferably, an insulating material is deposited on an ILD and planarized, thus burying the bit line contact plug 95 in the ILD.

As described with reference to FIGS. 3 through 28, the semiconductor devices according to the exemplary embodiments of the present invention include a bit line 25 buried in a substrate 12 and a isolation layer 45, which is disposed parallel to the bit line 25 without overlapping the bit line 25 and defines an active region. The device further includes a gate line 75, which includes a gate pattern 65 and a conductive line 70. The gate pattern 65 is formed in the active region, and the conductive line 70 extends at a right angle to the bit line 25 across the active region and is electrically connected to the gate pattern 65 disposed thereunder. Also, the device further includes a bit line capping layer 30, which is disposed on the bit line having a surface substantially co-planner with a surface of the substrate 12. Also, the device may further include a liner insulating pattern 20a.

Further, the devices may include a bit line contact plug 95 and a storage node 110 or 110'. Here, the storage node contact plug 105 may be further formed under the storage node 110.

In the foregoing structure, the overlay margin is greatly improved, and since the stack height of a device is lower than that of a conventional device, a subsequent metalization process can be easily performed. Also, as it is possible to further increase the height of a storage node, capacitance can also be increased.

As explained thus far, unlike conventional methods of forming DRAMs which require patterns having a complicated shape and fine pitch, only simple line-and-space-type patterns and contact patterns are used to form cells, in accordance with exemplary embodiments of the present invention. Thus, when the resolution limit of exposure equipment is identical, devices having finer pitches can be manufactured. Thus, even if a resolution of exposure equipment is somewhat low, uniform patterns can be formed using an illumination system that is optimized for cell patterns.

Also, as a bit line is formed at a lower portion of a substrate and a gate line is formed having a very thin thickness, a contact overlay margin can be increased and gap filling can be improved in small pitch devices.

In conventional devices, since a storage node is formed considering alignment with both a bit line and a gate line, an overlay margin is very narrow. However, in the present invention, only alignment with a gate line is considered, and thus storage node can be formed, while increasing an overlay margin.

As a result, a contact, which connects upper and lower layers, can be formed in a large size and simple shape, and a capacitor may be formed directly on the gate line without a storage node contact plug. Therefore, a stack thickness for the same capacitance and also contact resistance are reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a bit line buried in a substrate, the bit line comprising conductive material disposed in a bottom portion of a trench formed in the substrate;
   an isolation layer comprising insulating material disposed in a first recessed groove in the substrate, wherein the isolation layer is disposed parallel to the bit line without overlapping the bit line and defines an active region; and
   a gate line comprising:
   a gate pattern formed of conductive material disposed in a second recessed groove in the active region of the substrate, the second recessed groove is located adjacent to the bit line trench, and
   a conductive line that extends on a surface of the substrate and traverses over the bit line and the active region and which is electrically connected to the gate pattern.

2. The device of claim 1, wherein the bit line is recessed in a line-type trench etched in the substrate, the device further comprising a bit line capping layer, which is disposed in the trench over the bit line and filling the trench such that a surface of the capping layer is substantially co-planar with the surface of the substrate.

3. The device of claim 2, further comprising a liner insulating pattern, which is disposed on the inner walls of the trench.

4. The device of claim 2, wherein the trench and the isolation layer have the same depth.

5. The device of claim 2, further comprising:
   an interlayer dielectric disposed on the gate line;
   a bit line contact plug, which is disposed in the interlayer dielectric and the bit line capping layer and connects a portion of the active region to the bit line; and
   a storage node, which is connected to the remaining portion of the active region via the interlayer dielectric.

6. The device of claim 5, further comprising a storage node contact plug, which is disposed between the remaining portion of the active region and the storage node.

7. The device of claim 5, wherein the bit line contact plug is buried in the interlayer dielectric.

8. The device of claim 7, wherein the substrate includes a cell region and a core region,
   and wherein the bit line is disposed in the cell region and partially overlaps the core region,
   the device further comprises:
   a bit line interconnection contact, which is connected to the bit line via the interlayer dielectric; and a bit line pattern, which is connected to the bit line by the bit line interconnection contact and disposed on the interlayer dielectric of the core region.

9. The device of claim 1, wherein a top surface of the bit line is disposed higher than a bottom of the gate pattern.

10. The device of claim 1, wherein the conductive material of the gate pattern fills the groove such that a surface of the gate pattern is substantially co-planar with a surface of the substrate, and wherein the device further comprises a gate oxide layer, which is disposed on the inner walls of the second recessed groove for the gate line.

11. The device of claim 1, wherein the gate pattern and the conductive line are integrally formed.

* * * * *